(12) United States Patent
Eppolito

(10) Patent No.: US 8,965,774 B2
(45) Date of Patent: Feb. 24, 2015

(54) AUTOMATIC DETECTION OF AUDIO COMPRESSION PARAMETERS

(75) Inventor: Aaron M. Eppolito, Santa Cruz, CA (US)

(73) Assignee: Apple Inc., Cupertino, CA (US)

(*) Notice: Subject to any disclaimer, the term of this patent is extended or adjusted under 35 U.S.C. 154(b) by 760 days.

(21) Appl. No.: 13/215,534

(22) Filed: Aug. 23, 2011

(65) Prior Publication Data

US 2013/0054251 A1 Feb. 28, 2013

(51) Int. Cl.
*G10L 19/00* (2013.01)
*G10L 21/0316* (2013.01)
*H03G 7/00* (2006.01)

(52) U.S. Cl.
CPC ............ *G10L 21/0316* (2013.01); *H03G 7/002* (2013.01); *H03G 7/007* (2013.01)
USPC ........... 704/500; 381/106; 381/107; 381/108; 381/120; 381/312; 715/716; 700/94; 704/225; 704/233

(58) Field of Classification Search
CPC ..... G10L 19/008; G10L 19/24; G10L 19/167; G10L 21/038; G11B 20/10527
USPC ........................................................ 704/500
See application file for complete search history.

(56) References Cited

U.S. PATENT DOCUMENTS

| | | | |
|---|---|---|---|
| 3,732,371 A * | 5/1973 | Burwen .......................... 381/106 |
| 4,887,299 A * | 12/1989 | Cummins et al. ............. 381/317 |
| 4,922,537 A * | 5/1990 | Frederiksen .................. 704/212 |
| 4,972,164 A * | 11/1990 | Akagiri et al. ................... 333/14 |
| 5,027,410 A * | 6/1991 | Williamson et al. .......... 381/320 |
| 5,241,689 A * | 8/1993 | Schwed et al. ................. 455/517 |
| 5,278,912 A * | 1/1994 | Waldhauer ..................... 381/320 |
| 5,488,668 A * | 1/1996 | Waldhauer ..................... 381/320 |
| 5,524,060 A * | 6/1996 | Silfvast et al. ................. 381/104 |
| 5,553,134 A * | 9/1996 | Allen et al. ............. 379/390.03 |
| 5,553,151 A * | 9/1996 | Goldberg ....................... 381/312 |
| 5,737,389 A * | 4/1998 | Allen ............................ 379/1.01 |
| 5,768,292 A | 6/1998 | Galbi |
| 5,918,223 A * | 6/1999 | Blum et al. ........................... 1/1 |
| 6,317,613 B1 * | 11/2001 | Brown, Jr. ...................... 455/570 |
| 6,365,817 B1 | 4/2002 | Suzuki et al. |
| 6,392,135 B1 | 5/2002 | Kitayama |
| 6,507,658 B1 | 1/2003 | Abel et al. |
| 6,868,163 B1 * | 3/2005 | Goldstein ....................... 381/321 |
| 6,881,888 B2 | 4/2005 | Akazawa et al. |
| 6,944,474 B2 * | 9/2005 | Rader et al. ................. 455/550.1 |

(Continued)

OTHER PUBLICATIONS

U.S. Appl. No. 13/226,244, filed Sep. 6, 2011, Eppolito, Aaron M.

(Continued)

*Primary Examiner* — Pierre-Louis Desir
*Assistant Examiner* — Fariba Sirjani
(74) *Attorney, Agent, or Firm* — Adeli LLP

(57) ABSTRACT

For a media clip that includes audio content, a novel method for performing dynamic range compression of the audio content is presented. The method performs an analysis of the audio content. Based on the analysis of the audio content, the method generates a setting for an audio compressor that compresses the dynamic range of the audio content. The generated setting includes a set of audio compression parameters that include a noise gating threshold parameter ("noise gate"), a dynamic range compression threshold parameter ("threshold"), and a dynamic range compression ratio parameter ("ratio").

25 Claims, 16 Drawing Sheets

(56) References Cited

U.S. PATENT DOCUMENTS

| | | | |
|---|---|---|---|
| 6,968,564 B1 | 11/2005 | Srinivasan | |
| 7,050,966 B2* | 5/2006 | Schneider et al. | 704/200.1 |
| 7,072,477 B1 | 7/2006 | Kincaid | |
| 7,277,554 B2* | 10/2007 | Kates | 381/316 |
| 7,319,764 B1 | 1/2008 | Reid et al. | |
| 7,328,151 B2* | 2/2008 | Muesch | 704/228 |
| 7,383,509 B2 | 6/2008 | Foote et al. | |
| 7,428,488 B2* | 9/2008 | Saito | 704/225 |
| 7,430,296 B2* | 9/2008 | Spielbauer et al. | 381/104 |
| 7,457,757 B1* | 11/2008 | McNeill et al. | 704/500 |
| 7,548,791 B1 | 6/2009 | Johnston | |
| 7,580,531 B2* | 8/2009 | Anderson | 381/106 |
| 7,653,550 B2 | 1/2010 | Schulz | |
| 7,698,009 B2 | 4/2010 | Cotey et al. | |
| 7,742,746 B2* | 6/2010 | Xiang et al. | 455/63.1 |
| 7,756,281 B2 | 7/2010 | Goldstein et al. | |
| 7,769,189 B1 | 8/2010 | Moulios et al. | |
| 7,870,589 B2 | 1/2011 | Ducheneaut et al. | |
| 7,945,142 B2 | 5/2011 | Finkelstein et al. | |
| 7,970,153 B2* | 6/2011 | Konagai et al. | 381/104 |
| 8,006,195 B1 | 8/2011 | Woodings et al. | |
| 8,085,941 B2* | 12/2011 | Taenzer | 381/57 |
| 8,165,328 B2* | 4/2012 | Bramslow et al. | 381/312 |
| 8,225,207 B1* | 7/2012 | Ramirez | 715/716 |
| 8,229,125 B2* | 7/2012 | Short | 381/56 |
| 8,339,475 B2* | 12/2012 | Atanassov et al. | 348/229.1 |
| 8,352,052 B1* | 1/2013 | Green et al. | 700/94 |
| 8,467,547 B2* | 6/2013 | Breitschadel | 381/106 |
| 8,494,182 B2* | 7/2013 | Spielbauer | 381/106 |
| 8,548,614 B2* | 10/2013 | Kirkeby et al. | 700/94 |
| 8,583,247 B1* | 11/2013 | Hood et al. | 607/57 |
| 8,634,578 B2* | 1/2014 | Vickers | 381/94.3 |
| 8,660,676 B2* | 2/2014 | Aichner et al. | 700/94 |
| 8,676,361 B2* | 3/2014 | Paddock et al. | 700/94 |
| 8,787,596 B2* | 7/2014 | Craig et al. | 381/107 |
| 2002/0138795 A1 | 9/2002 | Wang | |
| 2002/0143545 A1 | 10/2002 | Tamura et al. | |
| 2002/0177967 A1 | 11/2002 | Fuchs et al. | |
| 2003/0035549 A1* | 2/2003 | Bizjak et al. | 381/56 |
| 2003/0059066 A1 | 3/2003 | Kohyama et al. | |
| 2003/0223597 A1* | 12/2003 | Puria et al. | 381/104 |
| 2004/0066396 A1 | 4/2004 | Hatakenaka | |
| 2004/0120554 A1 | 6/2004 | Lin et al. | |
| 2004/0122662 A1 | 6/2004 | Crockett | |
| 2004/0125962 A1* | 7/2004 | Christoph | 381/59 |
| 2004/0264714 A1 | 12/2004 | Lu et al. | |
| 2005/0042591 A1 | 2/2005 | Bloom et al. | |
| 2005/0256594 A1* | 11/2005 | Wong et al. | 700/94 |
| 2005/0273321 A1 | 12/2005 | Choi | |
| 2006/0126865 A1* | 6/2006 | Blamey et al. | 381/102 |
| 2006/0156374 A1 | 7/2006 | Hu et al. | |
| 2006/0256980 A1* | 11/2006 | Pritchard | 381/104 |
| 2006/0262938 A1* | 11/2006 | Gauger et al. | 381/56 |
| 2007/0121965 A1* | 5/2007 | Joseph et al. | 381/104 |
| 2007/0121966 A1 | 5/2007 | Plastina et al. | |
| 2007/0195975 A1* | 8/2007 | Cotton et al. | 381/104 |
| 2007/0237334 A1* | 10/2007 | Willins et al. | 381/57 |
| 2007/0292106 A1 | 12/2007 | Finkelstein et al. | |
| 2008/0002844 A1 | 1/2008 | Chin | |
| 2008/0069385 A1* | 3/2008 | Revit | 381/321 |
| 2008/0080721 A1 | 4/2008 | Reid et al. | |
| 2008/0095380 A1* | 4/2008 | Hanna | 381/2 |
| 2008/0253577 A1 | 10/2008 | Eppolito | |
| 2008/0253592 A1 | 10/2008 | Sanders et al. | |
| 2008/0256136 A1 | 10/2008 | Holland | |
| 2009/0063159 A1* | 3/2009 | Crockett | 704/500 |
| 2009/0103752 A1 | 4/2009 | Chou et al. | |
| 2009/0129601 A1 | 5/2009 | Ojala et al. | |
| 2009/0226152 A1* | 9/2009 | Hanes | 386/109 |
| 2010/0027820 A1* | 2/2010 | Kates | 381/312 |
| 2010/0189266 A1 | 7/2010 | Oh et al. | |
| 2010/0280638 A1 | 11/2010 | Matsuda et al. | |
| 2011/0013084 A1 | 1/2011 | Black | |
| 2011/0016077 A1* | 1/2011 | Vasilache et al. | 706/52 |
| 2012/0185068 A1 | 7/2012 | Eppolito | |
| 2012/0195433 A1 | 8/2012 | Eppolito et al. | |
| 2012/0198317 A1 | 8/2012 | Eppolito et al. | |
| 2012/0210223 A1 | 8/2012 | Eppolito | |
| 2012/0269369 A1* | 10/2012 | Yanz et al. | 381/314 |
| 2013/0010973 A1* | 1/2013 | Ma | 381/23.1 |
| 2013/0061143 A1* | 3/2013 | Eppolito | 715/716 |
| 2013/0061144 A1* | 3/2013 | Eppolito | 715/716 |
| 2014/0044268 A1* | 2/2014 | Herberger et al. | 381/56 |
| 2014/0188467 A1* | 7/2014 | Jing et al. | 704/233 |

OTHER PUBLICATIONS

U.S. Appl. No. 13/226,252, filed Sep. 6, 2011, Eppolito, Aaron M.
Author Unknown, "Additional Presets," Month Unknown, 2007, pp. 1-2, iZotope, Inc., USA.
Author Unknown, "Using Adobe Premiere Elements 8 Editor," last updated Aug. 12, 2010, 313 pages, Adobe Systems Incorporated, San Jose, California, USA.
Author Unknown, "Adobe Premiere Pro CS3: User Guide," Apr. 1, 2008, 455 pages, Adobe Systems Incorporated, San Jose, California, USA.
Author Unknown, "Apple Announces Final Cut Pro 4," NAB, Apr. 6, 2003, pp. 1-3, Apple Inc., Las Vegas, Nevada, USA.
Author Unknown, "Frame-specific editing with Snap", Adobe Premiere Pro CS4 Classroom in a Book, Dec. 17, 2008, 17 pages, Adobe Press, USA.
Author Unknown, "Octogris by UDM," May 8, 2012, 2 pages, KVR Audio Plugin Resources, USA.
Author Unknown, "PCM 81 Presets," Month Unknown, 1998, 8 pages, Lexicon Inc., Bedford Massachusetts, USA.
Author Unknown, "Spectron—64-bit Spectral Effect Processor," Month Unknown, 2007, pp. 1-3, iZotope, Inc, Cambridge, Massachusetts, USA.
Author Unknown, "iMovie '08 Getting Started," Month Unknown, 2008, pp. 1-50, Apple Inc., USA.
Lee, Taejin, et al., "A Personalized Preset-based Audio System for Interactive Service," Audio Engineering Society (AES) 121$^{st}$ Convention, Oct. 5-8, 2006, pp. 1-6, San Francisco, California, USA.
Sauer, Jeff, "Review: Apple Final Cut Pro 4", Oct. 3, 2003, pp. 1-7, USA.

* cited by examiner

AUTOMATIC DETECTION OF AUDIO COMPRESSION PARAMETERS

BACKGROUND

Many of today's computing devices, such as desktop computers, personal computers, and mobile phones, allow users to perform audio processing on recorded audio or video clips. These computing devices may have audio and video editing applications (hereafter collectively referred to as media content editing applications or media-editing applications) that provide a wide variety of audio processing techniques, enabling media artists and other users with the necessary tools to manipulate the audio of an audio or video clip. Examples of such applications include Final Cut Pro® and iMovie®, both sold by Apple Inc. These applications give users the ability to piece together different audio or video clips to create a composite media presentation.

Dynamic range compression is an audio processing technique that reduces the volume of loud sounds or amplifies quiet sounds by narrowing or "compressing" an audio signal's dynamic range. Dynamic range compression can either reduce loud sounds over a certain threshold while letting quiet sounds remain unaffected, or increase the loudness of sounds below a threshold while leaving louder sounds unchanged.

An audio engineer can use a compressor to reduce the dynamic range of source material in order to allow the source signal to be recorded optimally on a medium with a more limited dynamic range than that of the source signal or to change the character of an instrument being processed. Dynamic range compression can also be used to increase the perceived volume of audio tracks, or to balance the volume of highly-variable music. This improves the listenability of audio content when played through poor-quality speakers or in noisy environments.

Performing useful dynamic range compression for audio content requires the adjustment of many parameters such as a noise gate threshold (noise gate), a dynamic range compression threshold (threshold), and a dynamic range compression ratio (ratio). In order to achieve a useful dynamic range reduction, one must adjust the threshold parameter and the ratio parameter so that the audio compressor achieves the desired dynamic range compression with few obvious unpleasant audio effects. One must also adjust the noise gate parameter to avoid letting too much noise through and to avoid attenuating too much useful audio. The adjustment of these and other parameters requires sufficient knowledge in acoustics, or at least several rounds of trial-and-error by a determined user.

What is needed is an apparatus or a method that determines and supplies a set of audio dynamic range compression parameters to an audio compressor, and a method or apparatus that automatically computes the noise gate, threshold, and ratio parameters so that the user of a media editing application can quickly and easily accomplish useful dynamic range compression on any given audio content.

SUMMARY

For a media clip that includes audio content, some embodiments provides a method that performs analysis of the audio content and generates a setting for an audio compressor that compresses the dynamic range of the audio content. The generated setting includes one or more audio compression parameters. In some embodiments, the audio compression parameters include a noise gate threshold parameter ("noise gate"), a dynamic range compression threshold parameter ("threshold"), and a dynamic range compression ratio parameter ("ratio").

The method in some embodiments performs the analysis of the audio content by detecting a floor audio level ("floor") and a peak audio level ("peak") for the media clip. Some embodiments determine the floor and the peak according to the statistical distribution of the different audio levels. In some of these embodiments, the floor and the peak are determined based on the audio level at a preset percentile value or at a preset number of standard deviations away from the mean audio level. In some embodiments, the floor audio level and the peak audio level are detected based on the lowest and the highest measured audio levels.

The detected floor and peak audio levels serve as the basis for the determination of the noise gate, threshold, and ratio parameters in some embodiments. For the noise gate parameter, some embodiments use the detected floor as the noise gate. For the threshold parameter, some embodiments select an audio level at a particular preset percentile value that is above the floor audio level.

To compute the ratio parameter, some embodiments define a target range and a detected range. Some embodiments define the detected range as the ratio between the detected peak and the detected floor. Some embodiments define the target range according to user preference. The ratio parameter specifies the amount of gain reduction that has to be applied to audio signals above the threshold parameter in order to compress the detected range into the target range.

Instead of generating one set of audio compression parameters for the entire media clip, some embodiments partition the audio content into multiple components, with each of the audio content components having its own set of audio compression parameters. Some embodiments partition the audio content into various frequency components. Some embodiments partition the audio content temporally in order to generate audio compression parameters that track audio levels of the media content at different points in time.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

For a media clip that contains audio content, some embodiments provide a method for generating a set of parameters for performing dynamic range compression on the audio content. In some embodiments, such parameters are generated based on an analysis of the audio content. The generated parameters are then provided to an audio compressor to perform dynamic range compression on the audio content.

Figure 1:
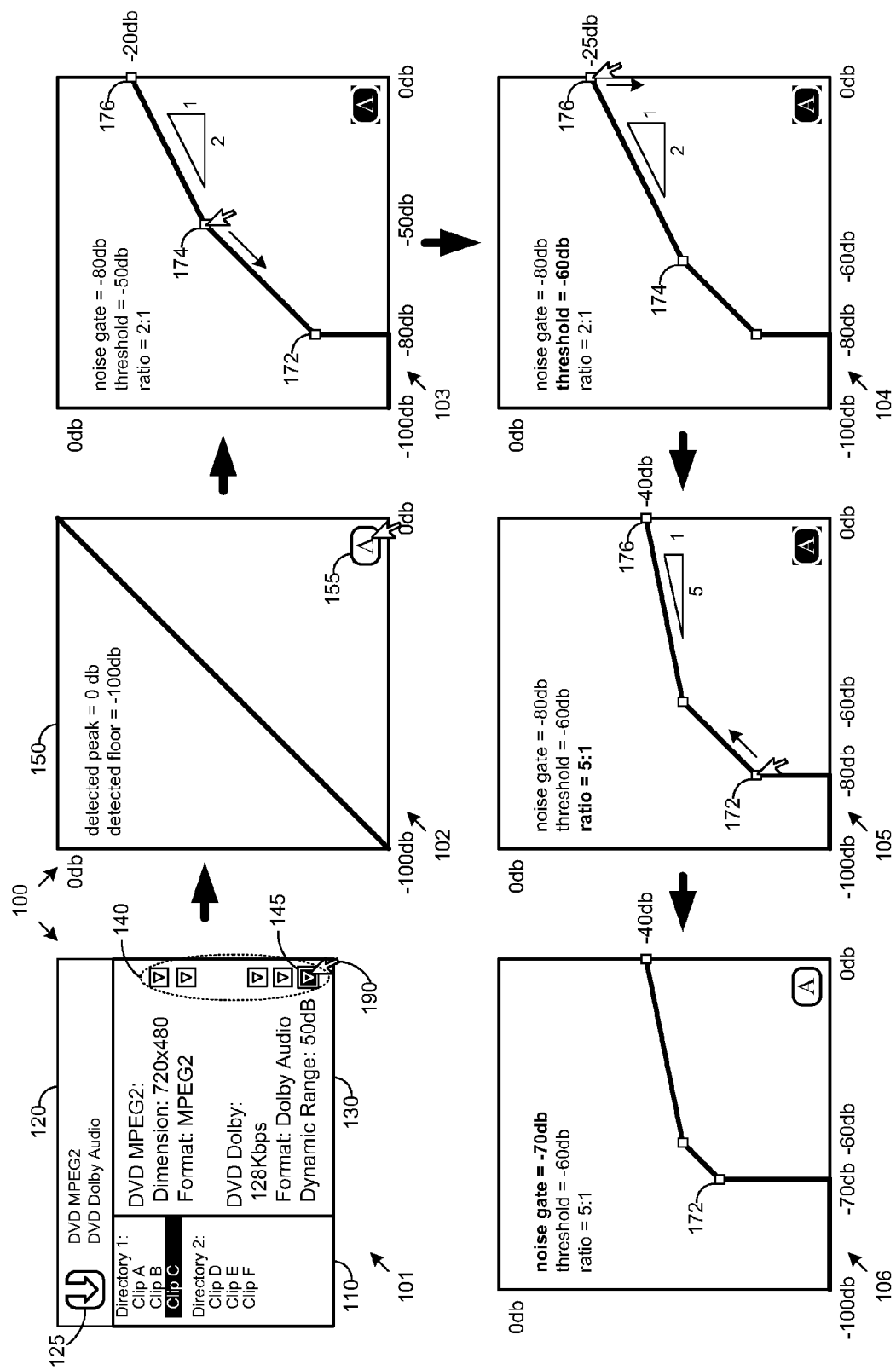
FIG. 1 illustrates an example of a media editing application performing an audio dynamic range compression operation based on parameters that are automatically generated.

For some embodiments of the invention, FIG. 1 illustrates an example of a media editing application performing an audio dynamic range compression operation based on parameters that are automatically generated. FIG. 1 illustrates the audio compression operation in six stages 101-106 of a graphical user interface (GUI) 100 of the media editing application. In some embodiments, the GUI 100 is an interface window provided by the media editing application for performing conversion or compression of media clips or media projects. As shown in this figure, the GUI 100 includes a source media area 110, a conversion destination area 120, a conversion activation UI item 125, a conversion inspector area 130, a dynamic range adjustment window 150, and an audio compression parameter detection UI item 155. In some embodiments, the GUI 100 also includes a user interaction indicator such as a cursor 190.

The source media area 110 is an area in the GUI 100 through which the application's user can select media clips or projects (video, audio, or composite presentation) to perform a variety of media conversion operations such as data compression, data rate conversion, dynamic range compression, and format conversion. The source media area includes several representations of individual media clips or media projects that can be selected for operations (e.g., through a drag-and-drop operation or a menu selection operation). The clips in the source media area 110 are presented as a list, but the clips in the source media area may also be presented as a set of icons or some other visual representation that allows a user to view and select the various clips or projects in the library. In the example of FIG. 1, a media clip labeled "Clip C" is highlighted, indicating that it is selected for further operations.

The conversion destination area 120 displays the destination format of the media conversion process. The conversion destination area 120 displays both video destination format and audio destination format. In the example illustrated, the video destination format is "DVD MPEG2", while the audio destination format is "DVD Dolby Audio". In other words, the media editing application would convert a source media selected from the source media area 110 into a file in which the video is in the format of DVD MPEG2 and the audio is in the format of DVD Dolby Audio. In addition to destination formats that are for making DVDs, the media editing application can also include destination formats for making YouTube videos, BlueRay discs, PodCasts, QuickTime movies, HDTV formatted content, or any other media formats. The conversion destination area also includes the conversion activation UI item 125. The selection of UI item 125 causes the media editing application to activate the media conversion process that converts the selected source media clip from the source media area 110 into the destination format as indicated in the conversion destination area 120 and the conversion inspector area 130.

The conversion inspector area 130 provides detailed information or settings of the destination formats in the conversion destination area 120. At least some of the settings are user adjustable, and the conversion inspector area 130 provides an interface for adjustments to the adjustable settings. The conversion inspector area also includes setting adjustment UI items 140, each of which, if selected, enables the user to make further adjustments to the settings associated with the setting adjustment UI item. Some of the UI items 140 bring up a menu for additional sub-options for the associated settings, while others bring up interface windows to allow further adjustments of the associated settings. One of the UI items 140 in particular (UI item 145) is associated with the setting item "Dynamic Range". Its default setting ("50 dB") indicates that the media editing application would perform audio dynamic range compression such that the resultant compressed audio would have a dynamic range of 50 dB. In some embodiments, the default value reflects the dynamic range of a source media clip (i.e., before any compression). In some embodiments, the default value reflects a recommended dynamic range for the destination audio format. In the example of FIG. 1, the UI item 145 is highlighted to indicate that the dynamic range adjustment has been selected by the user.

Figure 2:
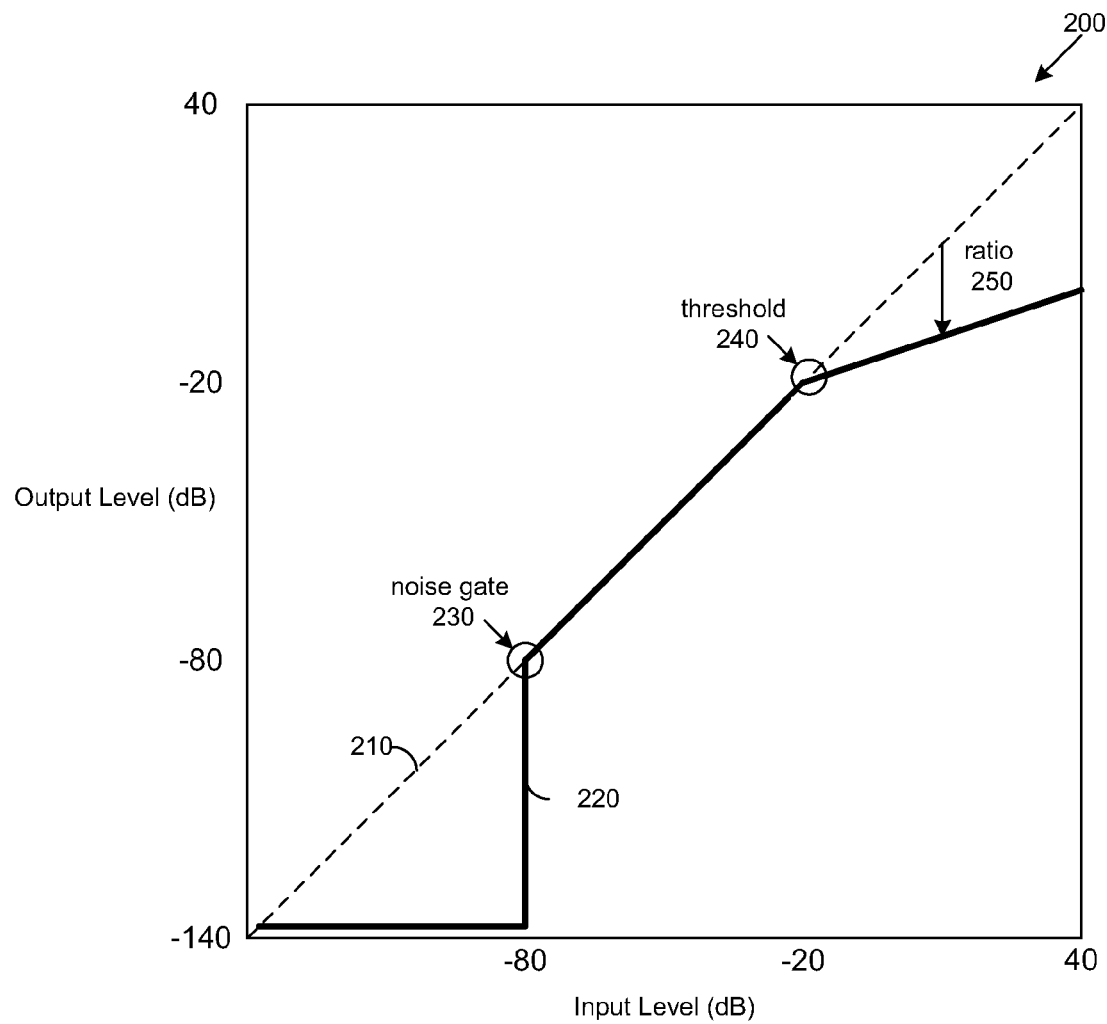
FIG. 2 illustrates an example dynamic range compression graph that reports the relationship between the input and the output of an audio compressor.

The dynamic range adjustment area 150 is an interface window that allows the user to adjust the dynamic range of the selected source media clip by performing audio dynamic range compression. In some embodiments, this window appears after the selection of the dynamic range UI item 145 in the conversion inspector area 130. The dynamic range adjustment area 150 graphically reports the dynamic range compression operation by reporting the relationship between the input and the output of an audio compressor that performs dynamic range compression. FIG. 2 illustrates an example dynamic range compression graph 200 that reports the relationship between the input and the output of the audio compressor that is in the dynamic range adjustment area 150 of some embodiments.

The horizontal axis of the dynamic range compression graph 200 in FIG. 2 is the level of the audio input to a system that is to perform the dynamic range compression. The unit of measure of the audio input level is in decibels ("dB"), which is computed as $20 \times \log_{10}(V_{RMS})$, $V_{RMS}$ being the root mean square amplitude of the audio signal. The vertical axis of the graph 200 is the level of the audio output from the system. The unit of measure of the audio output level is also in decibels.

The dashed line 210 shows the relationship between input level and output level if there is no dynamic range compression. The input level at which an audio signal enters the system is the same as the output level at which the audio signal exits the system. The slope of the dashed line is therefore 1:1. The solid line 220 shows the relationship between input level and output level when audio compression is performed on an audio signal according to a noise gate threshold parameter 230 ("noise gate"), a dynamic range compression threshold parameter 240 ("threshold"), and a dynamic range compression ratio parameter 250 ("ratio").

The noise gate parameter 230 is a set threshold that controls the operation of a noise gate device. In some embodiments, an audio compressor is a noise gate device that performs noise gating functionalities. The noise gate device controls audio signal pass-through. The noise gate does not remove noise from the signal. When the gate is open both the signal and the noise will pass through. The noise gate device allows a signal to pass through only when the signal is above the set threshold (i.e., the noise gate parameter). If the signal falls below the set threshold, no signal is allowed to pass (or the signal is substantially attenuated). The noise gate parameter (i.e., the set threshold of the noise gate device) is usually set above the level of noise so the signal is passed only when it is above noise level.

The threshold parameter 240 in some embodiments is a set threshold level that, if exceeded, causes the audio compressor to reduce the level of the audio signal. It is commonly set in dB, where a lower threshold (e.g., −60 dB) means a larger portion of the signal will be treated (compared to a higher threshold of −5 dB).

The ratio parameter 250 determines the amount of gain reduction that is to be applied to an audio signal at an input level higher than a set threshold level (i.e., the threshold parameter). A ratio of 4:1 means that if the input signal level is at 4 dB over the threshold, the output signal level will be at 1 dB over the threshold. The gain (level), in this case, would have been reduced by 3 dB. For example, if the threshold is at −10 dB and the input audio level is at −6 dB (4 dB above the threshold), the output audio level will be at −9 dB (1 dB above the threshold). The highest ratio of ∞:1 is often known as 'limiting'. It is commonly achieved using a ratio of 60:1, and effectively denotes that any signal above the threshold will be brought down to the threshold level.

In the example illustrated in FIG. 2, the noise gate parameter is set at −80 dB, the threshold parameter is set at −20 dB, and the ratio parameter is set at 3:1. This means that an audio signal that is below the noise gate parameter −80 dB will be treated as noise and will not be allowed to pass (or will be substantially attenuated), while an audio signal above the threshold parameter −20 dB will be reduced according to the ratio of 3:1. For example, a signal at 10 dB (30 dB above the −20 dB threshold) will be reduced to −10 dB (10 dB above the −20 dB threshold) according to the 3:1 dynamic range compression ratio.

The adjustment of the dynamic range of the audio content of a media clip often involves the adjustment of the three audio compression parameters (noise gate, threshold, and ratio). In addition to graphing the relationship between the input audio and output audio of the audio compressor, the dynamic range adjustment area 150 of FIG. 1 also provides the audio compression parameter detection UI item 155.

The audio compression parameter detection UI item 155 of FIG. 1 is a conceptual illustration of one or more UI items that cause the media editing application to perform automatic detection of audio compression settings on the audio content of a media clip. Different embodiments of the invention implement these UI items differently. Some embodiments implement them as selectable UI buttons. Some embodiments implement them as commands that can be selected in pull-down or drop-down menus. Still some embodiments implement them as commands that can be selected through one or more keystroke operations. Accordingly, the selection of the audio compression parameter detection UI item 155 may be received from a cursor controller (e.g., a mouse, a touchpad, a trackball, etc.), from a touchscreen (e.g., a user touching a UI item on a touchscreen), or from a keyboard input (e.g., a hotkey or a key sequence), etc. Yet other embodiments allow the user to access the automatic audio compression parameter detection feature through two or more of such UI implementations or other UI implementations.

The six stages 101-106 of the audio dynamic range compression operation of FIG. 1 will now be described. The first stage 101 shows the GUI 100 before the audio dynamic range compression operation. At the first stage 101, the source media area 110 indicates that media clip "Clip C" is selected for media format conversion and the conversion destination area 120 indicates that "Clip C" is to be converted into DVD format. The cursor 190 is placed over the UI item 145 of the conversion inspector area 130 in order to allow further adjustments of the dynamic range during the media format conversion process. Stage 101 does not show the dynamic range adjustment area 150 or the audio compression parameter detection UI item 155, because the dynamic range adjustment area 150 is a pop-up window that appears only after dynamic range setting adjustment UI item 145 has been selected in some embodiments. However, some embodiments always display the dynamic range adjustment area 150.

The second stage 102 shows the GUI 100 after the activation of the dynamic range adjustment. The dynamic range adjustment area 150 appears in the foreground. Stages 102-106 do not illustrate the source media area 110, the conversion destination area 120, or the conversion inspector area 130 because they are in the background where no visible changes take place. At the second stage 102, the dynamic range compression graph in the dynamic range adjustment area 150 shows a straight line, indicating that no audio compression parameters have been set, and that output audio levels would be the same as input audio levels. In some embodiments, the media editing application also detects a peak audio level and a floor audio level for subsequent determination of the audio compression parameters. The second stage 102 also shows the cursor 190 placed over the audio compression parameter detection UI item 155 in order to activate the automatic detection of audio compression parameters.

The third stage 103 shows the GUI 100 after the automatic detection of audio compression parameters. As illustrated, the media editing application has performed the automatic detection of audio compression parameters and determines the noise gate parameter to be at −80 dB, the threshold parameter to be at −50 dB, and the ratio parameter to be 2:1. The dynamic range compression graph shows that audio levels below −80 dB will be substantially attenuated due to the noise gate parameter. Audio levels above −50 dB (i.e., the threshold parameter) will be reduced at a ratio of 2:1 (i.e., the ratio parameter).

The noise gate, threshold, and ratio parameters as determined by the automatic detection process can be further adjusted by the user. The dynamic range adjustment area 150 includes three adjustment handles 172, 174, and 176 that can be used by the user to further adjust the three parameters. The adjustment handles 172, 174, and 176 can be moved along the dynamic range compression graph to adjust the noise gate, threshold, and ratio parameters respectively.

The fourth, fifth, and sixth stages 104-106 show the GUI 100 while further adjustments of the three audio compression parameters are made. At the fourth stage 104, the handle 174 is moved from −50 dB to −60 dB (input) in order to move the threshold parameter to −60 dB. At the fifth stage 105, the handle 176 is moved from −25 dB to −40 dB (output) in order to adjust the ratio parameter from 2:1 to 5:1. At the sixth stage 106, the handle 172 is moved from −80 dB to −70 dB (input) in order to move the noise gate parameter to −70 dB.

Once the dynamic range parameters have been set, the user can invoke the media conversion process by using the conversion activation UI item 125 and convert "Clip C" into the DVD format with a new, compressed dynamic range specified by the three audio compression parameters (i.e., the noise gate parameter at −70 dB, the threshold parameter at −60 dB, and the ratio parameter at 5:1).

In addition to controlling the noise gate, threshold, and ratio parameters, some embodiments also provide a degree of control over how quickly the audio compressor acts when the input audio signal crosses the audio level specified by the threshold parameter. For dynamic range compression above the ratio parameter, an 'attack' phase is the period when the compressor is decreasing gain to reach a target level that is determined by the ratio. The 'release' phase is the period when the compressor is increasing gain back to the original input audio level once the level has fallen below the threshold. The length of each period is determined by the rate of change and the required change in gain.

Figure 3A:
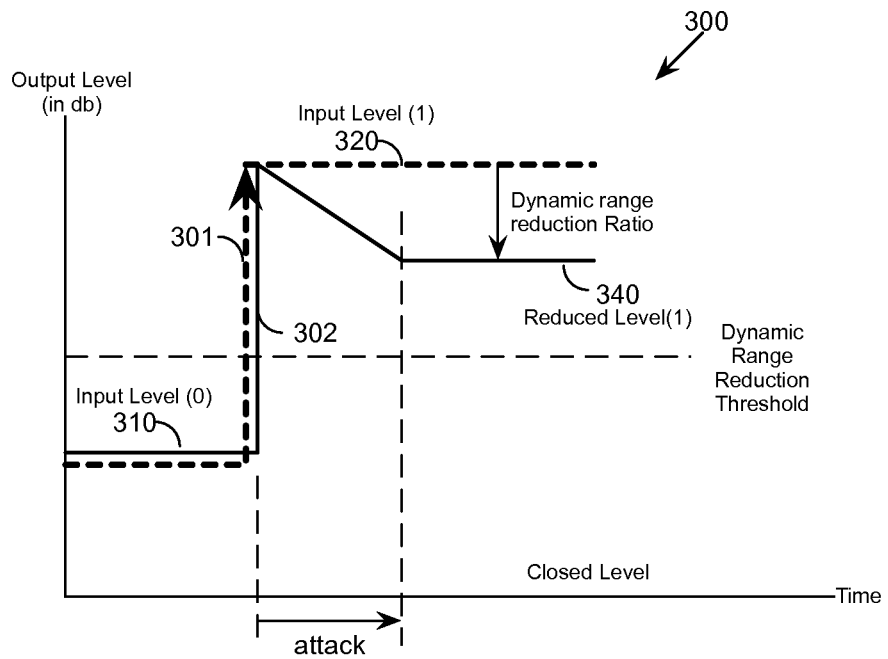
FIG. 3a illustrates the 'attack' of an audio compressor when the input audio level exceeds a threshold.

For some embodiments, FIG. 3a illustrates the 'attack' of the audio compressor when the input audio level exceeds the threshold parameter in a graph 300. As illustrated, both input audio signal 301 (bold dashed line) and output audio signal 302 (bold solid line) are initially at an audio level 310 ("input level (0)") that is below the threshold parameter level. However, when the input audio signal surges beyond the threshold parameter level to a level 320 ("input level (1)") that is higher than the threshold parameter, the output audio signal settles to a reduced level 340 ("reduced level (1)") over a period of time specified by the attack phase.

Figure 3B:
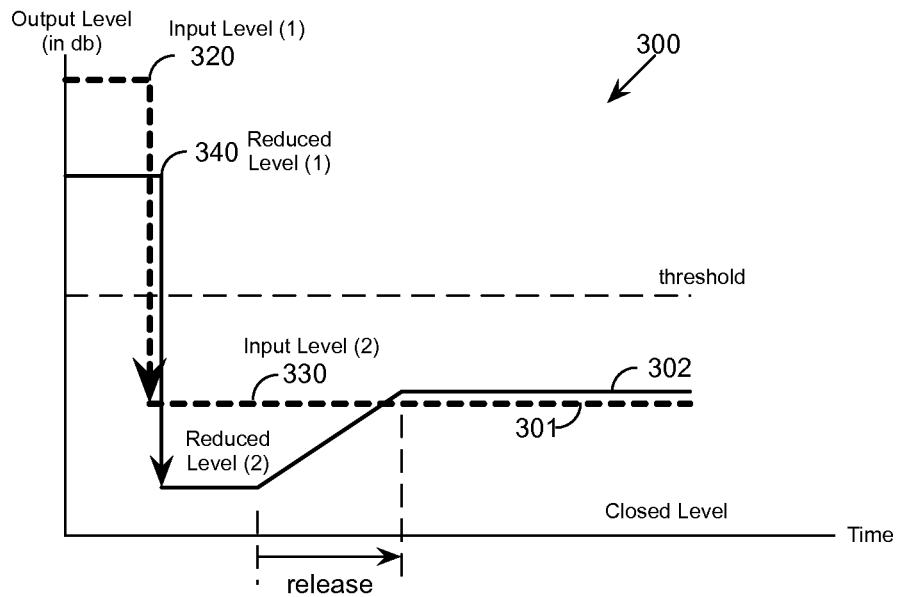
FIG. 3b illustrates the 'release' of an audio compressor when the input audio level falls below a threshold.

FIG. 3b illustrates the 'release' of the audio compressor when the input audio level falls below the threshold parameter in the graph 300. As illustrated, the input audio signal is initially at the high audio level 320 ("input level (1)") and the output audio signal is at the reduced level 340 ("reduced level (1)") due to the application of the ratio parameter as shown in FIG. 3a. When the audio level of the input audio signal 301 drops below the threshold level to an input level 330 ("input level (2)") that is lower than the threshold parameter, the output audio signal 302 settles to the same input level (2) 330 as the input audio signal 301 over a period of time that is specified by the release phase.

Some embodiments provide similar control over how quickly the audio compressor acts when the input audio signal crosses the noise gate parameter. The 'attack' corresponds to the time for the noise gate to change from closed to open (i.e., from preventing signal pass-through to allowing signals to pass). The 'hold' defines the amount of time the gate will stay open after the signal falls below the threshold. The 'release' sets the amount of time for the noise gate to go from open to closed (i.e., from passing signals to disallowing or substantially attenuating signals).

Figure 4:
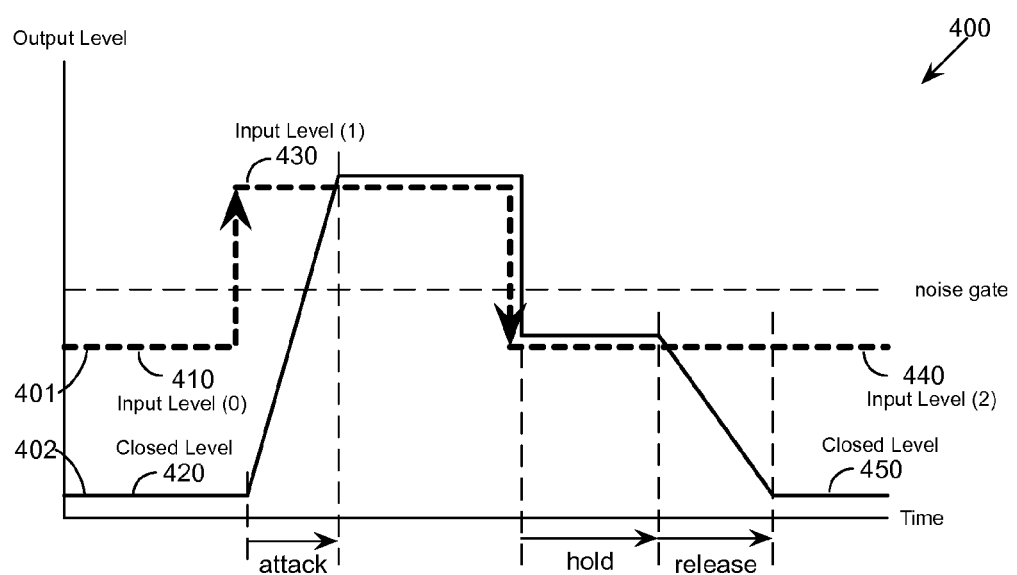
FIG. 4 illustrates the 'attack', 'hold', and 'release' phases of a noise gate.

For some embodiments, FIG. 4 illustrates the 'attack', 'hold', and 'release' phases of a noise gate in a graph 400. As illustrated, the input audio signal (bold dashed line) 401 is initially at level 410 ("input level (0)") while the output audio signal (bold solid line) 402 is initially at a substantially attenuated level 420 ("closed level") because the input audio signal is at a level below the noise gate parameter (noise gate threshold). When the input audio signal surges beyond the noise gate parameter and reaches a new level 430 ("input level (1)"), the output audio signal settles to the same level as input level (1) 430 over a period of time specified by the attack phase.

When the input audio signal falls below the noise gate parameter to another input level 440 ("input level (2)"), the output audio signal also transitions to the same level as the input level (2) 440 for a period of time specified by a hold phase. After the expiration of the hold phase, the output audio signal falls further to a substantially attenuated level 450 ("closed level") over a period of time specified by the release phase.

In some embodiments, the attack, release, and hold times of the dynamic range compression and noise gating operations of the audio compressor are adjustable by the user. In some embodiments, the attack and release times are automatically determined by hardware circuits and cannot be adjusted by the user. In some embodiments, the attack and release times are determined by an analysis of the input audio signal.

Figure 5:
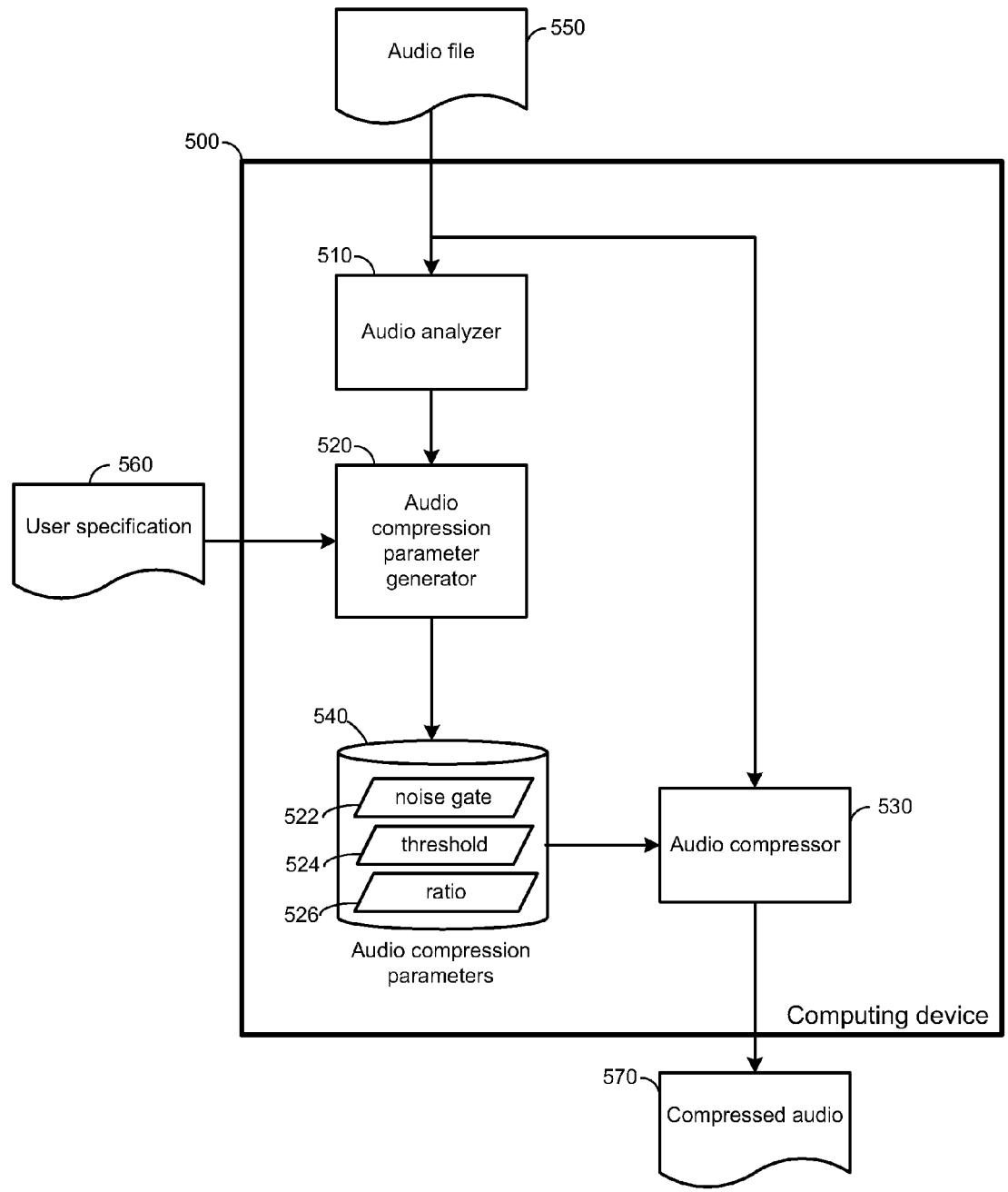
FIG. 5 illustrates an example block diagram of a computing device that performs audio compression setting detection.

For some embodiments of the invention, the audio compression setting detection is performed by a computing device. Such a computing device can be an electronic device that includes one or more integrated circuits (IC) or a computer executing a program, such as a media editing application. FIG. 5 illustrates an example block diagram of a computing device 500 that performs audio compression setting detection. The computing device 500 receives an audio file 550 and a user specification 560 and produces a compressed audio 570. The computing device includes an audio analyzer 510 and an audio compression parameter generator 520 that produces a set of audio compression parameters 540. The computing device in some embodiments also includes an audio compressor 530 for performing dynamic range compression based on the set of audio compression parameters 540.

The audio file 550 provides the audio content to be analyzed by the audio analyzer 510. The audio content is also provided to the audio compressor 530 for performing dynamic range compression. In some embodiments, the audio content from the audio file 550 is presented to the audio analyzer 510 or audio compressor 530 in real time as analog or digitized audio signals. In some embodiments, the audio content is presented to the audio analyzer 510 or the audio compressor 530 as computer readable data that can be stored in or retrieved from a computer readable storage medium.

The audio analyzer 510 analyzes the audio content from the audio file 550 and reports the result to the audio compression parameter generator 520. In some embodiments, the audio analyzer 510 performs the analysis of the audio content by detecting a floor audio level ("floor") and a peak audio level ("peak") for the media clip. Some embodiments determine the floor and the peak according to the statistical distribution of the different audio levels. In some of these embodiments, the floor and the peak are determined based on the audio level at a preset percentile value or at a preset number of standard deviations away from the mean audio level. In some embodiments, the floor audio level and the peak audio level are detected based on the lowest and the highest measured audio levels. The analysis of audio content and the operations of the audio analyzer 510 will be further described below by reference to FIG. 7.

The audio compression parameter generator 520 receives the result of the analysis of the audio content from the audio analyzer 510 and generates a set of audio compression parameters 540 for the audio compressor 530. As illustrated in FIG. 5, the set of audio compression parameters 540 includes the noise gate parameter 522, the threshold parameter 524, and the ratio parameters 526. The audio compression parameter generator 520 determines the noise gate, threshold, and ratio parameters based on the floor and peak audio levels detected by the audio analyzer 510.

In some embodiments, the generated audio compression parameters 540 are stored in a computer readable storage such as internal memory structure of a computer (e.g., SRAM or DRAM) or an external memory device (e.g., flash memory). The stored audio compression parameters can then be retrieved by an audio compressor (e.g. the audio compressor 530) immediately or at a later time for performing audio compression. In some embodiments, the stored audio compression parameters can be further adjusted, either by the user or by another automated process before being used by the audio compressor.

In some embodiments, the audio compression parameter generator 520 derives the set of audio compression parameters based on a user specification 560. In some embodiments, the user specification 560 includes a loudness specification and a uniformity specification. The loudness specification determines the overall gain that is to be applied to the audio content. The uniformity specification determines the amount of dynamic range compression that is to be applied to the audio content. In some embodiments, the uniformity specification determines the ratio parameter and the threshold parameter.

For the noise gate parameter, some embodiments use the detected floor as the noise gate. For the threshold parameter, some embodiments select an audio level at a particular preset percentile value that is above the floor audio level. To compute the ratio parameter, some embodiments define a target range and a detected range. The detected range is the ratio between the detected peak and the detected floor. The target range is defined according to user preference such as by the user specification 560 or by the "Dynamic Range" field in the conversion inspector window 130 of the GUI 100 of FIG. 1.

The generated audio compression parameters 540 are passed to the audio compressor 530 for performing dynamic range compression. Based on the audio compression parameters 540, the audio compressor 530 produces compressed audio 570 by performing dynamic range compression on the audio content of the audio file 550. Some embodiments do not pass the generated audio compression parameters directly to the audio compressor 530. Instead, the audio compression parameters are stored. Once stored, an audio compressor can perform audio compression elsewhere and/or at another time by using these audio compression parameters. In some embodiments, the computing device 500 does not include an audio compressor or perform dynamic range compression, but instead, only generates the audio compression parameters or.

Figure 6:
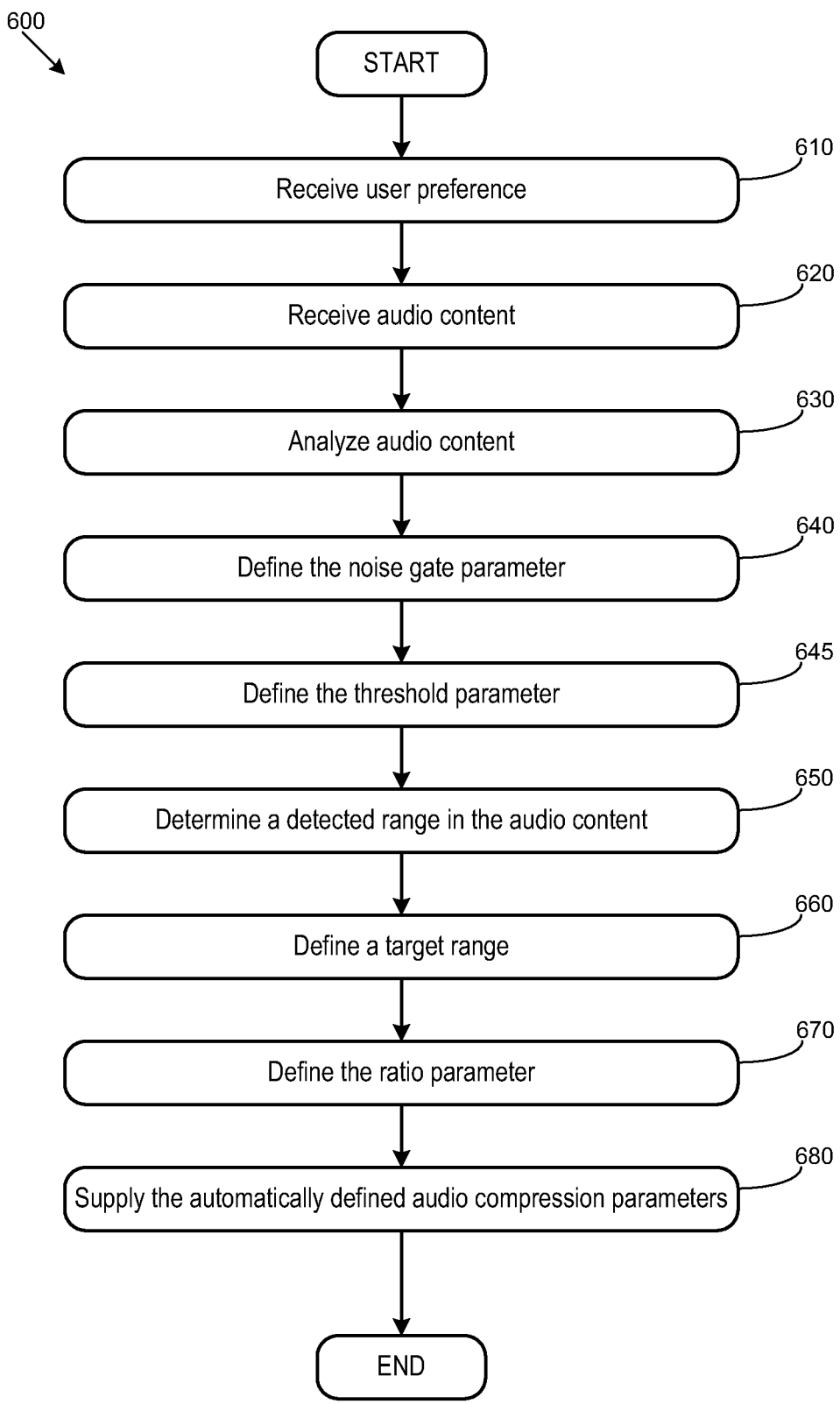
FIG. 6 conceptually illustrates a process 600 for performing an audio compression setting detection operation.

For some embodiments of the invention, FIG. 6 conceptually illustrates a process 600 for performing an audio compression setting detection operation. In some embodiments, the process 600 is performed by the computing device 500 of FIG. 5. The process starts when a media clip or an audio file is presented for dynamic range compression and for noise gating. In some embodiments, this process is activated when a user of a media editing application activates a command for performing automatic detection of audio compression settings. In the example of FIG. 5, this activation is accomplished via the audio compression parameter detection UI item 155.

The process receives (at 610) a user preference for audio compression. This preference is the basis upon which the audio compression parameters are generated. Some embodiments derive the threshold and ratio parameters from the uniformity and loudness specifications in the user preference. The user preference is specified by the user of a media editing application in some embodiments. Some embodiments provide a set of recommended settings without direct input from the user.

The process receives (at 620) audio content. In some embodiments, the audio content is delivered in real time as analog signals or packets of digitized audio samples. In some embodiments, the audio content is delivered as computer readable data that is retrieved from a computer readable storage medium.

Next, the process 600 analyzes (at 630) the audio content. The analysis of the audio content provides the necessary basis for subsequent determination of the audio compression parameters (noise gate, threshold, and ratio). Some embodiments detect a peak audio level and a floor audio level. Some embodiments also record the highest and the lowest measured audio levels or perform other statistical analysis of the audio content. The analysis of the audio content will be further described in Section I below by reference to FIG. 9.

The process 600 next defines (at 640) the noise gate parameter (noise gating threshold) based on the analysis of the audio content performed at 630. In some embodiments, the noise gate parameter is defined based on a floor level of the audio content. In some of these embodiments, the noise gate is defined at certain dB levels above a lowest measured level. In some embodiments, the noise gate parameter is determined based on the statistical data collected at operation 630 of the process.

The process 600 next defines (at 645) the threshold parameter (dynamic range compression threshold) based on the analysis of the audio content performed at 630. In some embodiments, the threshold parameter is defined at a preset level between a highest measured level and the lowest measured levels. In some embodiments, the threshold parameter is defined based on the statistical data collected at operation 630 of the process.

Different embodiments determine the noise gate parameter and the threshold parameter differently. The determination of the noise gate parameter and the threshold parameter as performed at 640 and 645 will be further described in Section II below by reference to FIGS. 8, 10, and 11.

Next, the process 600 determines (at 650) a detected range (or detected ratio) in the audio content. The process 600 also defines (at 660) a target range (or a target ratio). Having both determined the detected range and defined the target range, the process 600 then defines (at 670) the ratio parameter based on the target range and the detected range. The determination of the ratio parameter will be further described in Section III below by reference to FIG. 12.

Next, the process 600 supplies (at 680) the automatically defined audio compression parameters (noise gate, threshold, and ratio) to the audio compressor. In some embodiments, the process stores the computed compression parameters in a computer readable storage medium (such as a memory device) before delivering them to the audio compressor for performing audio dynamic range compression. After supplying the audio compression parameters, the process 600 ends.

I. Analyzing Audio Content

In order to automatically generate the noise gate, threshold, and ratio parameters based on the audio content, some embodiments first perform an analysis of the audio content. The analysis provides statistical data or measurements of the audio content that are used by some embodiments to compute the audio compression parameters.

Figure 7:
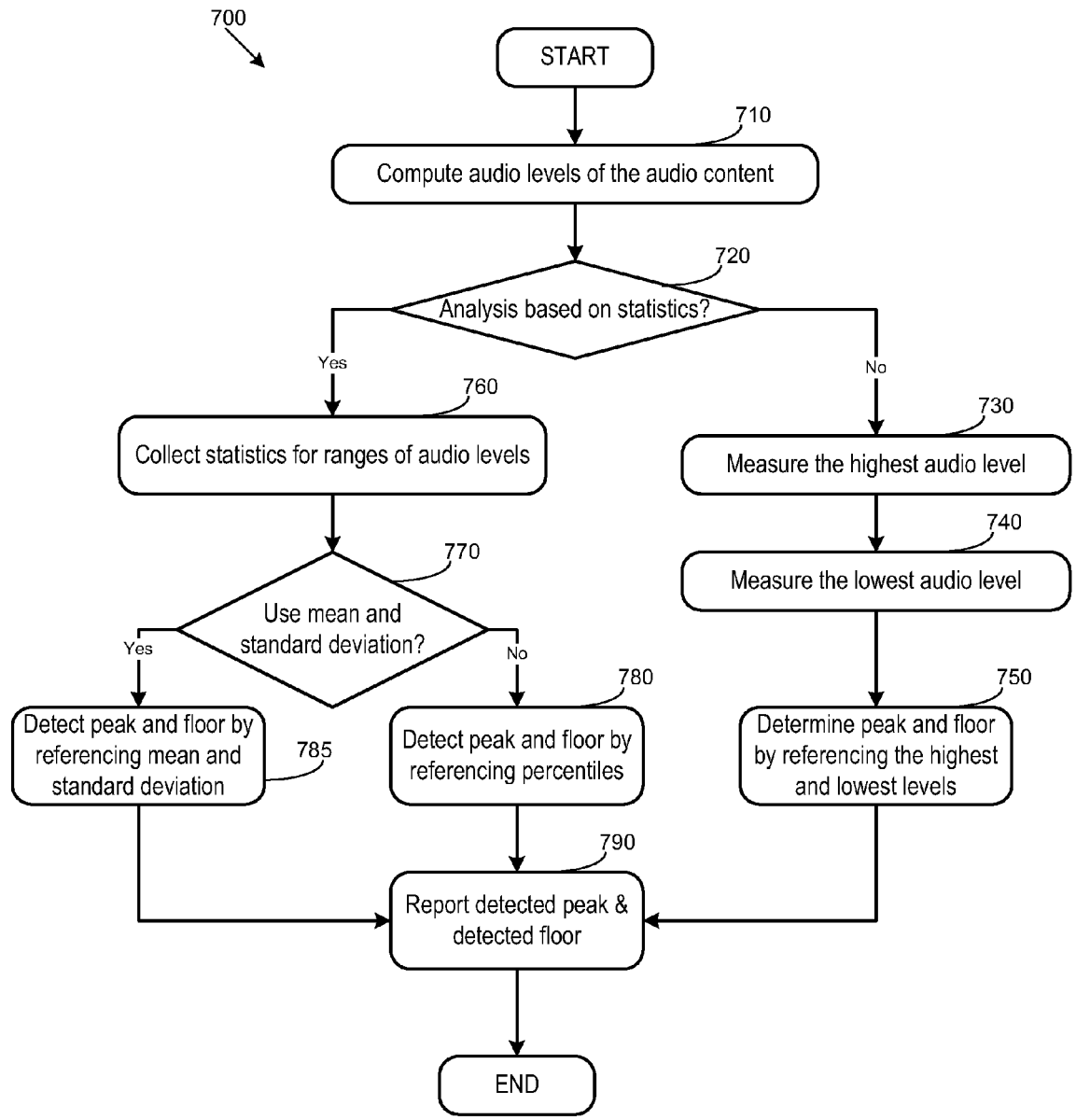
FIG. 7 conceptually illustrates a process 700 for performing an analysis of the audio content for the purpose of generating audio compression parameters.

For some embodiments of the invention, FIG. 7 conceptually illustrates a process 700 for performing an analysis of the audio content for the purpose of generating audio compression parameters. Some embodiments perform this process at 630 of the process 600 discussed above. In some embodiments, the process 700 is performed by the audio analyzer 510 of the computing device 500. The process 700 will be described by reference to FIGS. 8, 9, 10 and 11.

After audio content that is to have its dynamic range compressed has been received, the process 700 starts, in some embodiments, when a command to start automatic audio compression setting detection has been issued. The process computes (at 710) audio levels of the audio content. Audio signals are generally oscillatory signals that swing rapidly between positive and negative quantities. To meaningfully analyze the audio content, it is therefore useful to compute audio levels as a running average of the audio signal's magnitude or power.

In some embodiments, the running average used to analyze the audio content is based on the root mean square (RMS) amplitude of the audio content. RMS is a form of a low-pass filter based on the running average. The RMS amplitude of an audio signal is the square root of the arithmetic mean (average) of the squares of the audio signal over a window of time. For digitized audio content with digitized audio samples, the RMS amplitude $V_{RMS}$ is calculated according to $$V_{RMS} = \sqrt{\frac{x_0^2 + x_1^2 + x_2^2 + \cdots + x_{n-1}^2}{n}},$$

where $x_0, x_1, x_2 \ldots x_{n-1}$ are audio samples within the window of time. Since it is far more useful to compare different audio levels as ratios of amplitudes rather than as differences of amplitudes, some embodiments report audio levels using a logarithmic unit (i.e., decibels or dB).

Next, the process 700 determines (at 720) whether the analysis of the audio content is to be based on statistical analysis or measurement of audio levels. Analyzing the audio content based on statistical analysis of all audio levels in the audio content has the advantage of making the selection of the audio compression parameters less likely to be influenced by random noise and outlier samples. However, statistical analysis involves greater computational complexity than analyzing the audio content based on simple measurement of audio levels.

In some embodiments, determining whether to use statistical analysis is based on user preference. In some other embodiments, this determination is based on empirical data showing which approach yields the more useful result. In some of these embodiments having empirical data, the determination is made before the start of this process 700. In some embodiments, this determination is based on real-time information about available computing resources (e.g., CPU usage and memory usage) since statistical analysis consumes more computational resources than simple measurements.

If the analysis is to be based on measurements alone, the process proceeds to 730. If the analysis is to be based on statistics, the process 700 proceeds to 760.

At 730, the process 700 measures the highest audio level. The process 700 then measures (at 740) the lowest audio level. In some embodiments, the measurement of the highest audio level is a simple recording of the highest audio level detected within the audio content, and the lowest audio level is a simple recording of the lowest audio level detected within the audio content. Some embodiments apply a filter against noise before measuring the highest audio level or the lowest audio level.

Figure 8:
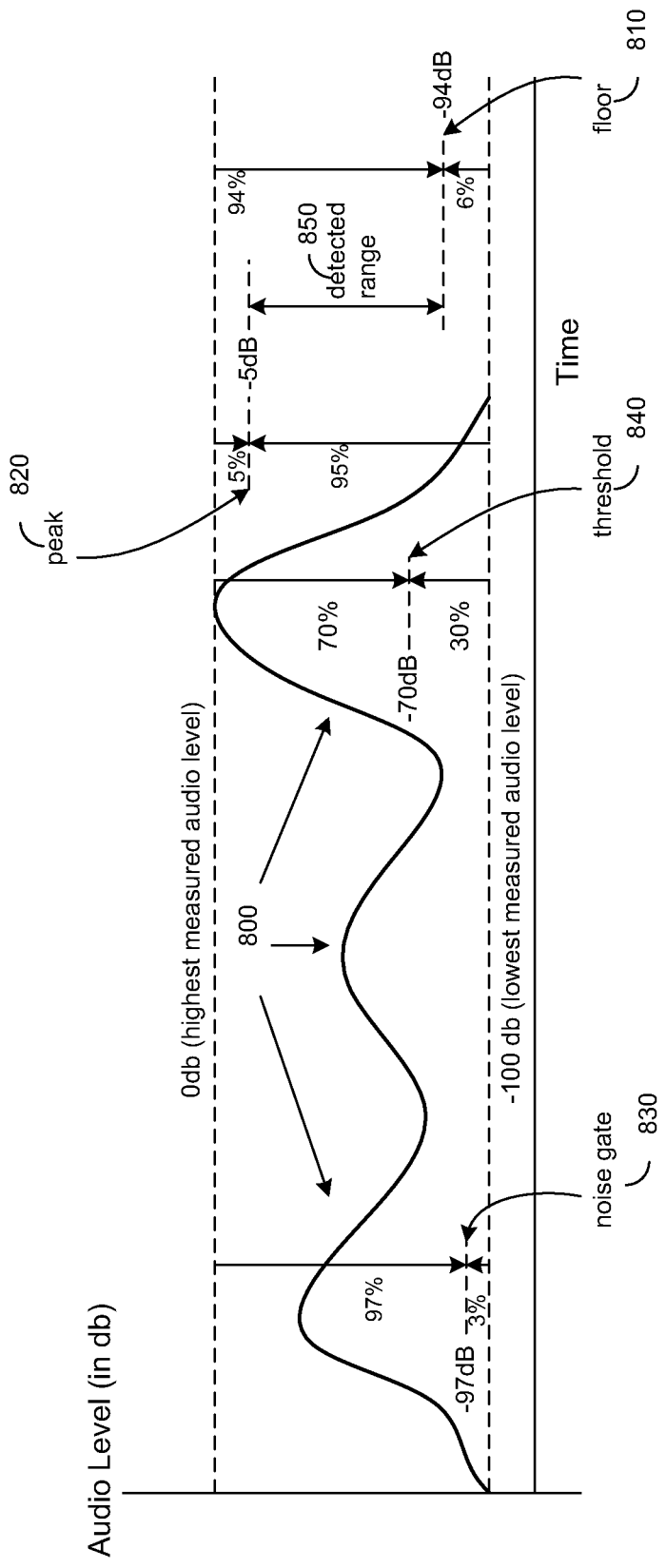
FIG. 8 illustrates setting parameters at empirically determined positions relative to the highest and lowest audio levels.

The process determines (at 750) the peak and floor audio levels by referencing the highest and lowest measured audio levels. The peak and floor audio levels are used for determining a detected range for computing the ratio parameter in some embodiments. Some embodiments set the peak and floor audio levels at empirically determined positions relative to the highest and lowest audio levels. FIG. 8 illustrates setting the peak audio level 820 and the floor audio level 810 of audio content 800. In this example, the RMS audio level of the audio content 800 is plotted against time. The highest audio level is measured at 0 dB, while the lowest audio level is measured at −100 dB. The peak audio level 820 is empirically set at an audio level that is 95% of the way from the lowest audio level to the highest audio level. The floor audio level 810 is empirically set at an audio level that is 6% of the way from the lowest audio level to the highest audio level. This translates to the peak 820 being at −5 dB and the floor 810 being at −94 dB. Once the peak and floor audio levels have been defined, the process 700 proceeds to 790.

Figure 9:
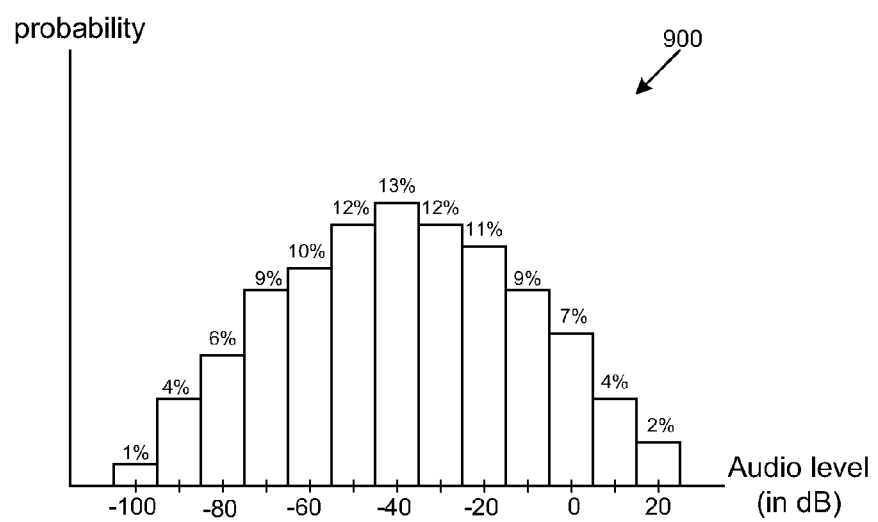
FIG. 9 illustrates an example histogram that shows statistics of the audio content collected at each range of audio levels.

At 760, the process 700 collects statistics across a number of different ranges of audio levels and produces a probability distribution of the audio content. FIG. 9 illustrates an example histogram 900 that shows statistics of the audio content collected at each range of audio levels. In this particular example, statistics are collected at 10 dB-wide ranges of audio levels from −100 dB to 20 dB.

In some embodiments, the statistics collected at each range include the amount of time that a signal level of the audio content is within the audio level range. For embodiments that receive audio content as digitized audio samples, the statistics collected at each range of audio levels includes a tally of the number of audio samples that are within the audio level range. In some embodiments, the statistics collected at each range are normalized with respect to the entire audio content such that the histogram is a probability distribution function that reports the probability at each range of audio levels. In the example of FIG. 9, the 12% probability shown at the −50 dB range indicates that 12% of the audio content is in the range between −45 dB and −55 dB. If the audio content from which the statistics are derived is 1 minute and 40 seconds long (100 seconds), the histogram 900 would indicate that 12 seconds of the audio content is at the audio level between −45 dB and −55 dB.

The process next determines (at 770) whether to use mean and standard deviation values or percentiles for detecting peak and floor audio levels. In some embodiments, this determination is based on user preference. In some other embodiments, this determination is based empirical data showing which approach yields the more useful result. In some of these embodiments having empirical data, the determination is made before the start of this process 700. If the analysis is to be based on percentiles of the audio content's probability distribution, the process 700 proceeds to 780. If the analysis is to be based on the mean and the standard deviation values of the audio content's probability distribution, the process proceeds to 785.

Figure 10:
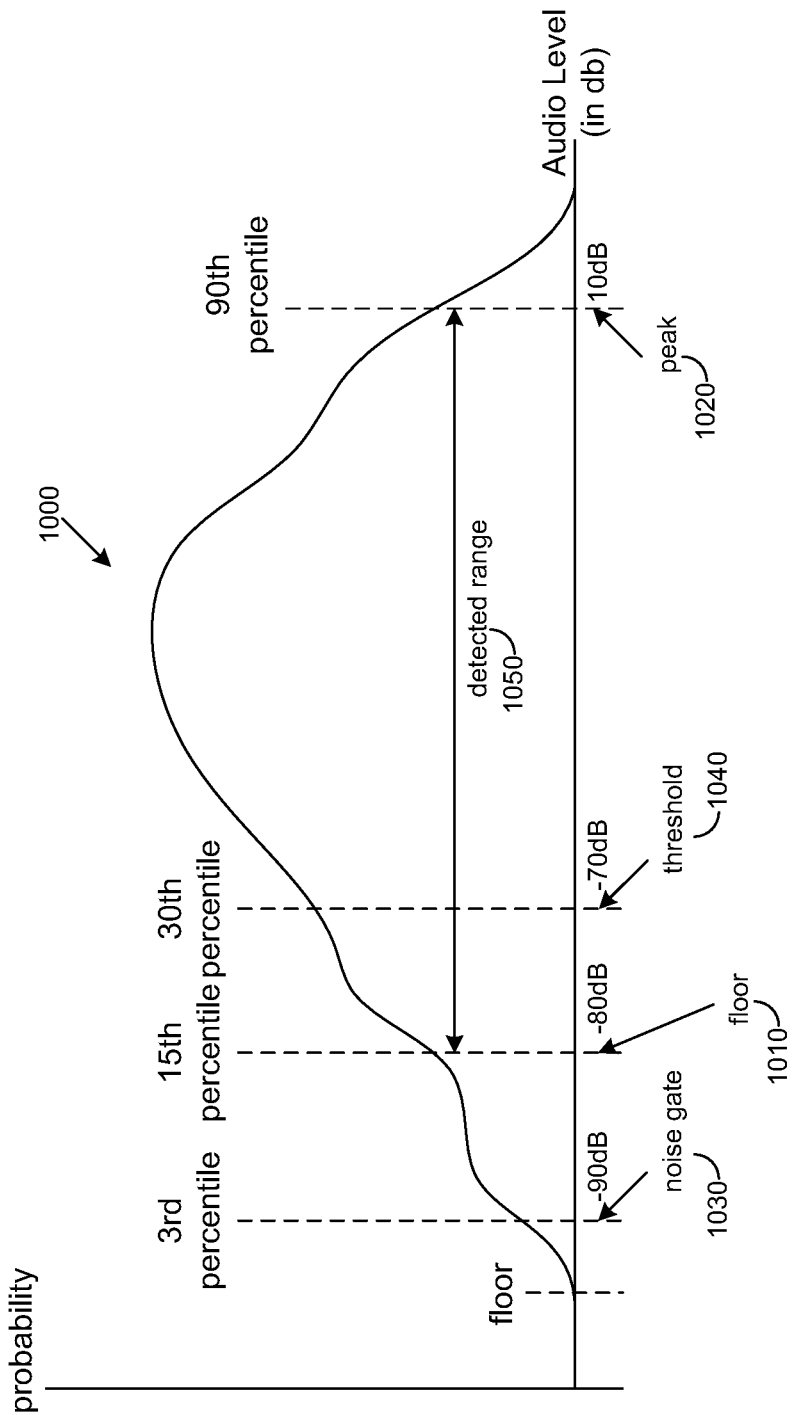
FIG. 10 illustrates setting parameters by identifying audio levels that are at certain percentile values of a probability distribution.

At 780, the process detects the peak and the floor by identifying audio levels that are at certain percentile values of the probability distribution of the audio content. (In statistics, a percentile is the value of a variable below which a certain percent of observations fall. For example, the 20th percentile is the audio level below which 20 percent of the audio samples may be found.) In some embodiments, the percentile values used to determine the peak and floor audio levels are preset values that are empirically chosen. FIG. 10 illustrates defining the floor and peak audio levels by identifying audio levels that are at certain percentile values of the probability distribution. FIG. 10 illustrates a histogram 1000 that is similar to the histogram 900 of FIG. 9. The histogram 1000 charts audio levels (in dB) on the horizontal axis and probability corresponding to the audio levels on the vertical axis. The peak is empirically set at the 90th percentile while the floor is empirically set at the 15th percentile. The audio level at the 90th percentile is 10 dB, hence the peak level is determined to be 10 dB. The audio level at the 15th percentile is −80 dB, hence the floor level is determined to be −80 dB. Once the detected peak and floor audio levels have been defined, the process 700 proceeds to 790.

At 785, the process detects the peak and the floor by referencing mean and standard deviation values of the audio content. A mean audio level μ is computed for the audio content (e.g., by averaging the audio level values for all audio samples). A standard deviation value σ is also computed for the audio content. If N is the number of audio samples and $x_i$ is the audio level (in dB) of the i-th audio sample, then in some embodiments the mean μ and the standard deviation σ are computed according to the following:

$$\mu = \frac{1}{N}\sum_{i=1}^{N} x_i, \sigma = \sqrt{\frac{1}{N} \cdot \sum_{i=1}^{N} (x_i - \mu)^2}$$

Figure 11:
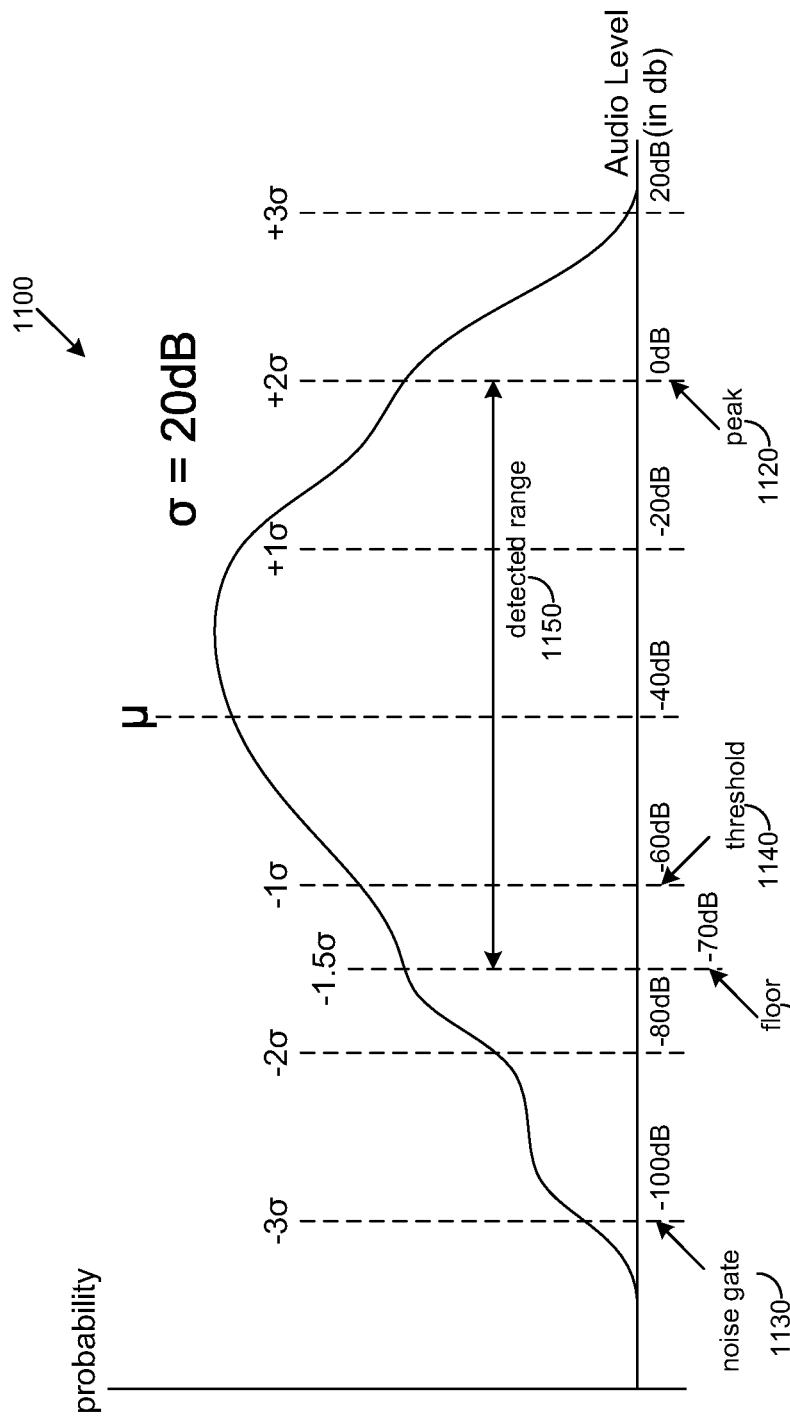
FIG. 11 illustrates setting parameters by using the mean and the standard deviation of the audio content.

FIG. 11 illustrates the definition of the floor and the peak audio levels by using the mean and the standard deviation of the audio content. In some embodiments, the floor and the peak are empirically chosen to be at certain multiples of the standard deviation. FIG. 11 also illustrates a histogram 1100 that plots probability distribution against different audio levels. In the example illustrated in FIG. 11, the floor audio level 1110 is empirically chosen to be at −1.5σ (1.5 standard deviations less than the mean value). The peak audio level 1120 is empirically chosen to be at +2σ (two standard deviations more than the mean value). The histogram 1100 is that of an example audio content that has a mean μ value at −40 dB and a standard deviation value σ of 20 dB. Since the audio level at −1.5σ from μ is −70 dB and the audio level at +2σ from μ is 0 dB, the floor 1110 and the peak 1120 will be defined as −70 dB and 0 dB, respectively. Once the detected peak and floor audio levels have been defined, the process 700 proceeds to 790.

At 790, the process reports the detected peak and the detected floor audio levels. Some embodiments use the detected peak and floor audio levels to compute a detected range. The detected range, in turn, is used to determine the ratio parameter. The determination of the ratio parameter will be discussed further in Section III below. The determination of the noise gate and the threshold parameter will be discussed next in Section II.

II. The Noise Gate Parameter and the Threshold Parameter

The noise gate parameter and the threshold parameter are determined based on the analysis of the audio content as discussed in Section I. In some embodiments, the noise gate and the threshold parameters are determined by referencing the highest and the lowest audio levels. In some embodiments, the noise gate and the threshold parameters are determined by referencing statistical constructs such as percentiles and standard deviation generated from the analysis of the audio content.

In addition to defining the peak and the floor audio levels, FIGS. 8, 10, and 11 as discussed in Section I above also illustrate setting the noise gate and threshold parameters. In the example illustrated in FIG. 8, the noise gate parameter 830 and the threshold parameter 840 are set at empirically determined positions relative to the highest and the lowest audio levels. As illustrated, the highest audio level is measured at 0 dB, while the lowest audio level is measured at −100 dB. The noise gate parameter is empirically set at an audio level that is 3% of the way from the lowest audio level to the highest audio level. The threshold parameter is empirically set at an audio level that is 30% of the way from the lowest audio level to the highest audio level. For the audio content in this example, this translates to the noise gate parameter 830 being at −97 dB and the threshold parameter 840 being at −70 dB.

FIGS. 10 and 11 illustrate setting the noise gate and threshold parameters at predetermined positions in the audio content's probability distribution. In the example illustrated in FIG. 10, the noise gate parameter is empirically set at the 3rd percentile of the probability distribution and the threshold parameter is empirically set at the 30th percentile of the probability distribution. For the audio content of this example, this translates to the noise gate parameter being set at −90 dB and the threshold parameter being set at −70 dB. In the example illustrated in FIG. 11, the noise gate parameter 1130 is empirically set at −3σ (3 standard deviations less than the mean) and the threshold parameter 1140 is empirically set at −1σ (1 standard deviation less than the mean). For the audio content of this example, this translates to the noise gate parameter being set at −100 dB and the threshold parameter being at set at −60 dB.

Although the detected floor and the detected peak in the examples of FIGS. 8, 10, and 11 illustrate the noise gate parameter and the threshold parameter as being separate from the detected floor and peak audio levels, some embodiments set the noise gate parameter and/or threshold parameter to be equal to the detected floor and/or peak levels in order to simplify computation. Furthermore, although FIGS. 8, 10, and 11 illustrate the floor, peak, noise gate, and threshold parameters as being at particular audio levels or as being at particular positions relative to other parameters or statistical constructs (such as percentile or standard deviations), one of ordinary skill would realize that the illustrated values for the noise gate parameter and the threshold parameter are for illustrative purpose only; they can be empirically determined to be at other audio levels or at other positions relative to other parameters or statistical constructs.

III. The Ratio Parameter

In addition to supplying the noise gate parameter and the threshold parameter to an audio compressor, some embodiments also supply a ratio parameter. The ratio parameter specifies the amount of gain reduction that has to be applied to audio signals above the threshold parameter in order to compress a detected range into a target range.

Figure 12:
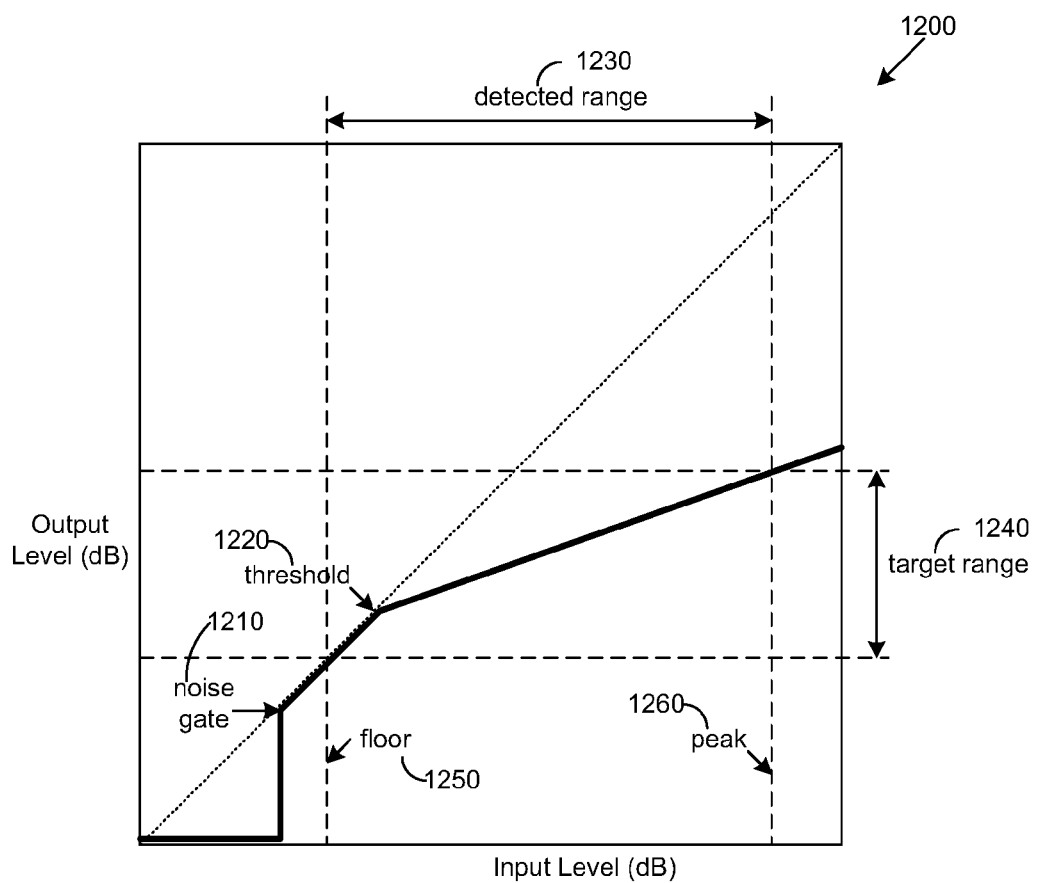
FIG. 12 illustrates an example relationship between the detected range, the target range, and the audio compression parameters (noise gate, threshold, and ratio).

For some embodiments, FIG. 12 illustrates an example relationship between a detected range 1230, the target range 1240, and the three audio compression parameters (noise gate, threshold, and ratio). Similar to the dynamic range compression graph 200 shown in FIG. 2, this figure illustrates a graph 1200 of an example dynamic range compression, in which the horizontal axis is the input audio level in dB and the vertical axis is the output audio level in dB. The output level is substantially attenuated below a noise gate level 1210 and reduced in gain above a threshold level 1220. The application of the ratio parameter causes a reduction in gain for input audio levels above the threshold level 1220 such that the detected range 1230 at the input of the audio compressor maps to the target range 1240 at the output of the audio compressor.

The target range 1240 specifies a range of output audio levels into which a range of input audio levels is to be compressed by the audio compressor in some embodiments. The range of input audio levels to be compressed is the detected range 1230. In some embodiments, the target range 1240 is based on an ideal preset. Some embodiments determine this ideal preset based on empirical results. Some embodiments also allow adjustment of this preset according to user preference. Such user preference in these embodiments can be specified by a user of a media editing application.

The detected range 1230 spans a range of input levels defined by a detected floor 1250 and a detected peak 1260. The detected range reflects a ratio (or difference in dB) between the detected peak audio level and the detected floor audio level at the input to the audio compressor. Different embodiments determine the floor audio level and the peak audio level differently. As discussed above in Section I by reference to FIG. 7, some embodiments determine the peak and floor by measuring the highest and lowest audio levels, while some embodiments determine the peak and the floor by performing statistical analysis. Once the peak and the floor have been determined, some embodiments calculate the detected range as the difference in decibels between the peak and the floor.

In the example of FIG. 8 as discussed above, the detected range 850 is defined as the difference between the peak 820 and the floor 810, which are defined, in turn, by referencing the highest and lowest audio levels. In the example of FIG. 10, the detected range 1050 is defined as the difference between the peak 1020 and the floor 1010, which are defined, in turn, by referencing percentile positions along the probability distribution of the audio content. In the example of FIG. 11, the detected range 1150 is defined as the difference between the peak 1120 and the floor 1110, which are defined, in turn, by referencing the mean and the standard deviation values of the probability distribution of the audio content.

Once the detected range and the target range have been determined, some embodiments define the ratio parameter based the difference in decibels between the target range and the detected range. For example, if the detected range is 26 dB (20:1 ratio) and the target range is 12 dB (4:1 ratio), some embodiments define the ratio parameter as 5:1.

IV. Audio Compression by Partition

Instead of generating one set of audio compression parameter for the audio content of an entire audio clip, some embodiments partition the audio content into multiple components, each of these components of the audio content having its own set of audio compression parameters. Some embodiments partition the audio content into various frequency components. Some embodiments partition the audio content temporally in order to generate audio compression parameters that track audio levels of the media content at different points in time.

Figure 13:
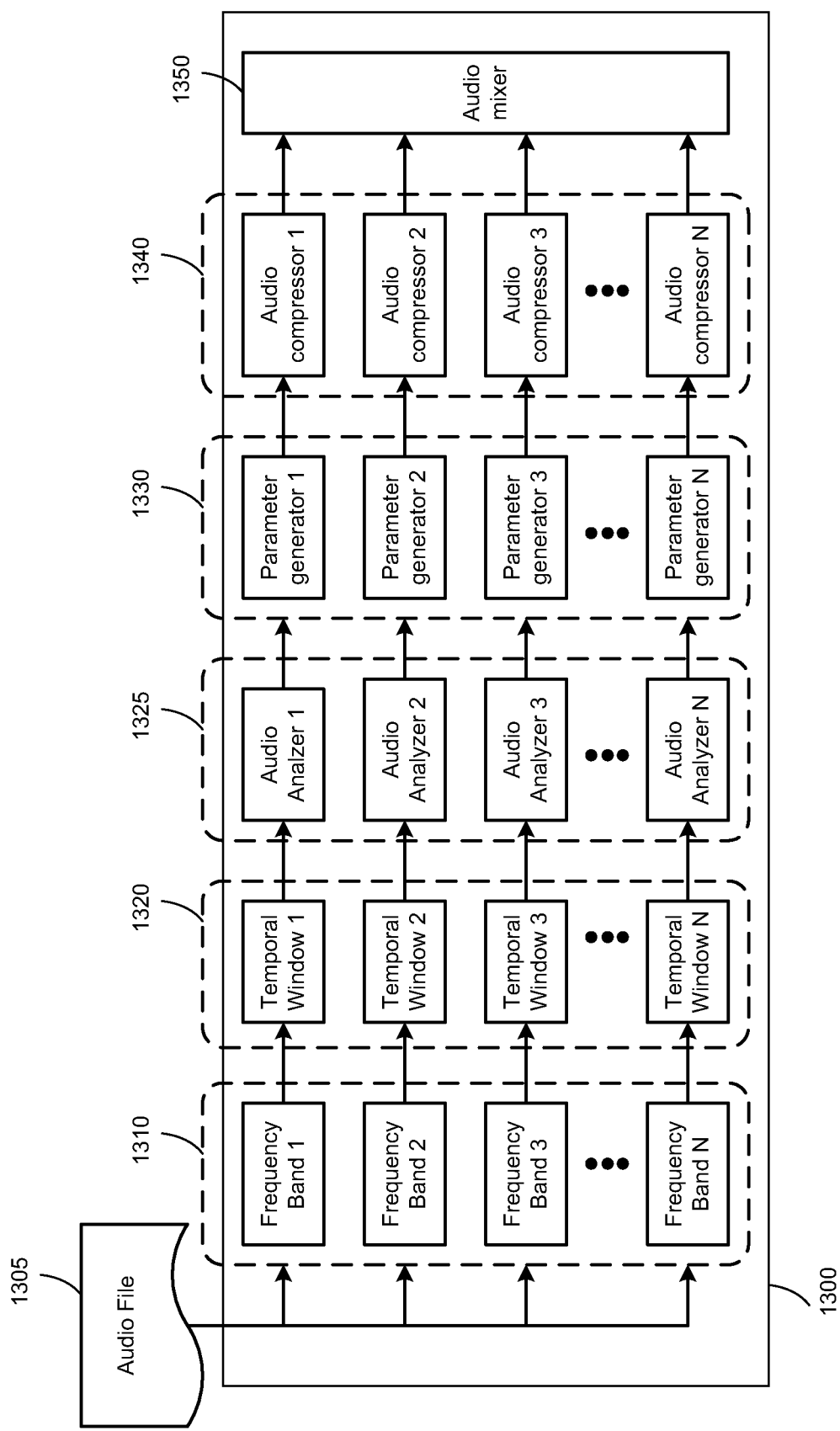
FIG. 13 illustrates a block diagram of a computing device that supplies separate sets of audio compression parameters for different frequency components and different temporal components.

FIG. 13 illustrates a block diagram of a computing device 1300 that supplies separate sets of audio compression parameters for different frequency components and different temporal components. Like the computing device 500 of FIG. 5, the computing device 1300 analyzes audio content and generates audio compression parameters based on the analysis of the audio content. However, the computing device 1300 partitions the audio content into different frequency bands and different temporal windows and generates different sets of audio compression parameters for the different components of the audio content. Dynamic range compression of the audio content is performed on each component based on the set of audio compression parameters generated for the component.

The computing device 1300 of FIG. 13 generates multiple sets of audio compression parameters based on the audio content it receives from the audio file 1305. The computing device 1300 includes band pass filters 1310, temporal window dividers 1320, audio analyzers 1325, parameter generators 1330, audio compressors 1340, and an audio mixer 1350.

Band filters 1310 perform filtering operations that divide the audio content into several frequency bands. Each of the band filters 1310 allows only audio signals within a certain frequency range to pass through. Different band filters allow different ranges of frequencies to go through. By dividing the audio content into different frequency bands, different audio compression settings can be applied to different frequency bands to make a particular type of sound louder and/or to make other types of sound quieter.

Temporal windows 1320 partition the audio content temporally so each temporal component would have its own set of audio compression parameters. This is advantageous when, for example, the audio content changes significantly over time. In such a situation, a set of audio compression parameters that improve the quality of a particular portion of the audio content may degrade the quality of another portion of the audio content. It is therefore advantageous to provide different sets of audio compression parameters for different temporal components of audio content.

Audio analyzers 1325 receive the partitioned audio content and perform the analysis needed for the generation of the audio compression parameters. Each of the audio analyzers 1325 is similar in functionality to the audio analyzer 510 and as discussed above by reference to FIG. 7. For embodiments that compute audio compression parameters by measuring the highest and lowest audio levels, each of the audio analyzers 1325 measures the highest and the lowest audio levels of its audio content partition component and computes peak and floor audio levels for the audio content partition component. For embodiments that compute audio compression parameters by performing statistical analysis, each of the audio analyzers 1325 collects statistical data of its audio content partition component and computes peak and floor audio levels for its audio content partition component.

Parameter generators 1330 receive the partitioned audio content and generate the audio compression parameters for each of the audio content partition components. In some embodiments, each parameter generator is similar in functionality to the audio compression parameter generator 520 of FIG. 5. In other words, each of the parameter generators 1330 generates a set of audio compression parameters (noise gate, threshold, and ratio) for its audio content partition component based on an analysis of its audio content partition component.

In some embodiments, both the audio analyzers 1325 and the parameter generators 1330 process the components sequentially. That is, each of analyzers 1325 (and each of parameter generators 1330) sequentially processes all temporal components of the audio content belonging to the same frequency band.

Audio compressors 1340 receive the sets of audio compression parameters and perform audio compression accordingly. In some embodiments, each audio compressor performs audio compression for audio content across all temporal components for one frequency band. In some of these embodiments, the audio compressor receives multiple sets of audio compression parameters as it generates compressed audio through the different temporal components. The compressed audio streams produced by the different audio compressors are then mixed together by the audio mixer 1350.

One of ordinary skill would recognize that some of the modules illustrated in FIG. 13 can be implemented as one single module performing the same functionality in a serial or sequential fashion. For example, some embodiments implement a single parameter generator that serially processes all audio content partition components from different frequency ranges and different temporal partition components. In some embodiments, a software module of a program being executed on a computing device performs the partitioning of the audio content and the generation of sets of audio compression parameters. Section V below describes a software architecture that can be used to implement the partitioning of audio content as well as the generation of multiple sets of audio compression parameters for the different components.

Figure 14:
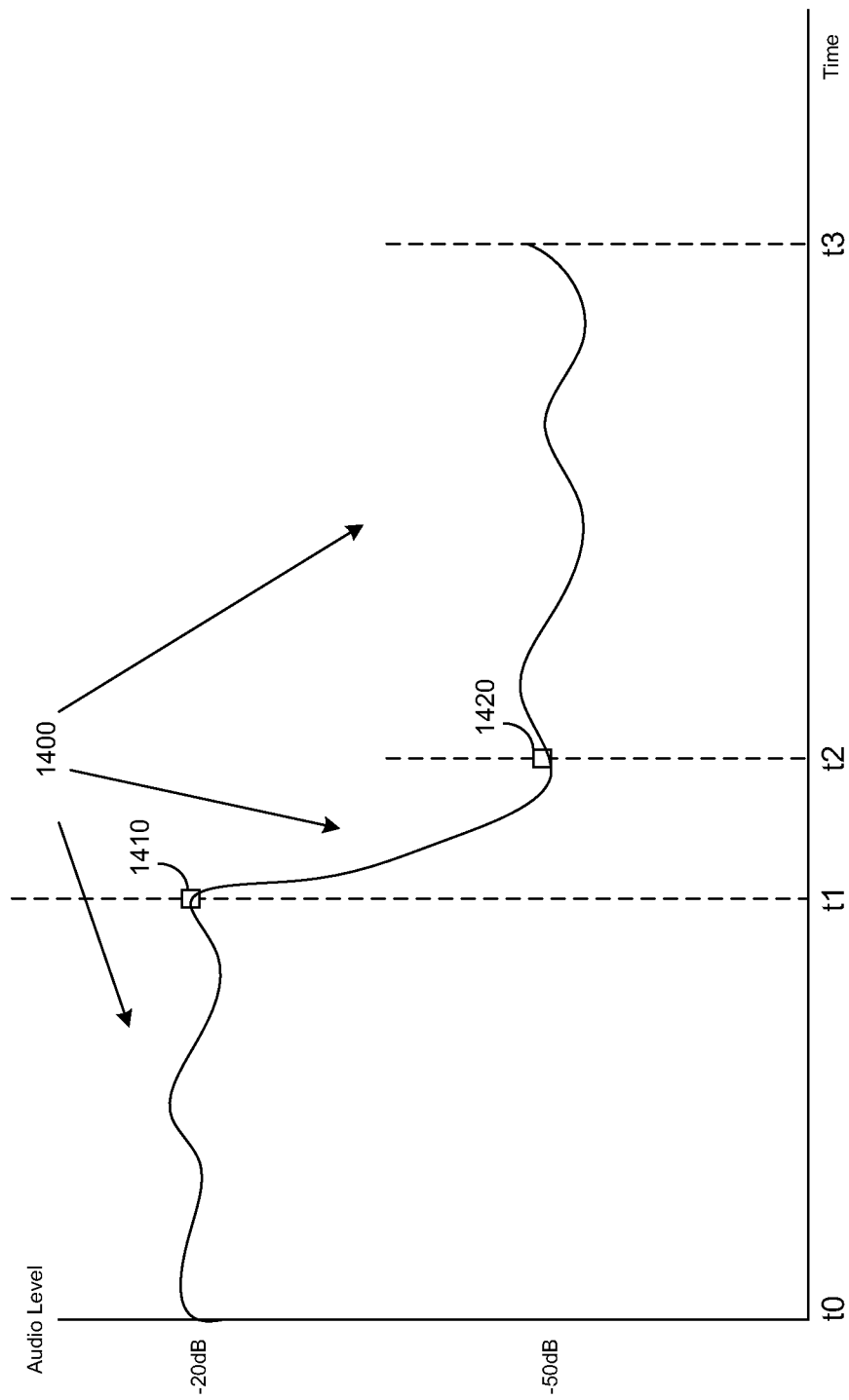
FIG. 14 conceptually illustrates an example adjustment of temporal markers for temporal partitioning of the audio content for audio compression.

In some embodiments, temporal partitioning is accomplished by temporal markers (or keyframes) that divide the audio content. In some embodiments, the temporal markers are adjustable by a user. In some embodiments, the temporal markers are automatically adjusted based on a long term running average of the audio content's signal level. FIG. 14 conceptually illustrates an example adjustment of temporal markers for temporal partitioning of the audio content for audio compression. As illustrated, an example long term average of audio content 1400 stays relatively constant at about −20 dB from time t0 to time t1. Temporal markers in this region will be removed (or will not be inserted) so that the audio content between times t0 and t1 uses the same set of audio compression parameters. As shown, the long term average dropped steeply from t1 to t2. A temporal marker 1410 is therefore inserted at t1 to indicate that a new set of audio compression parameters is needed. The long term average settles into a lower audio level around −50 dB after t2, which is free of additional temporal markers until t3.

V. Software Architecture

Figure 15:
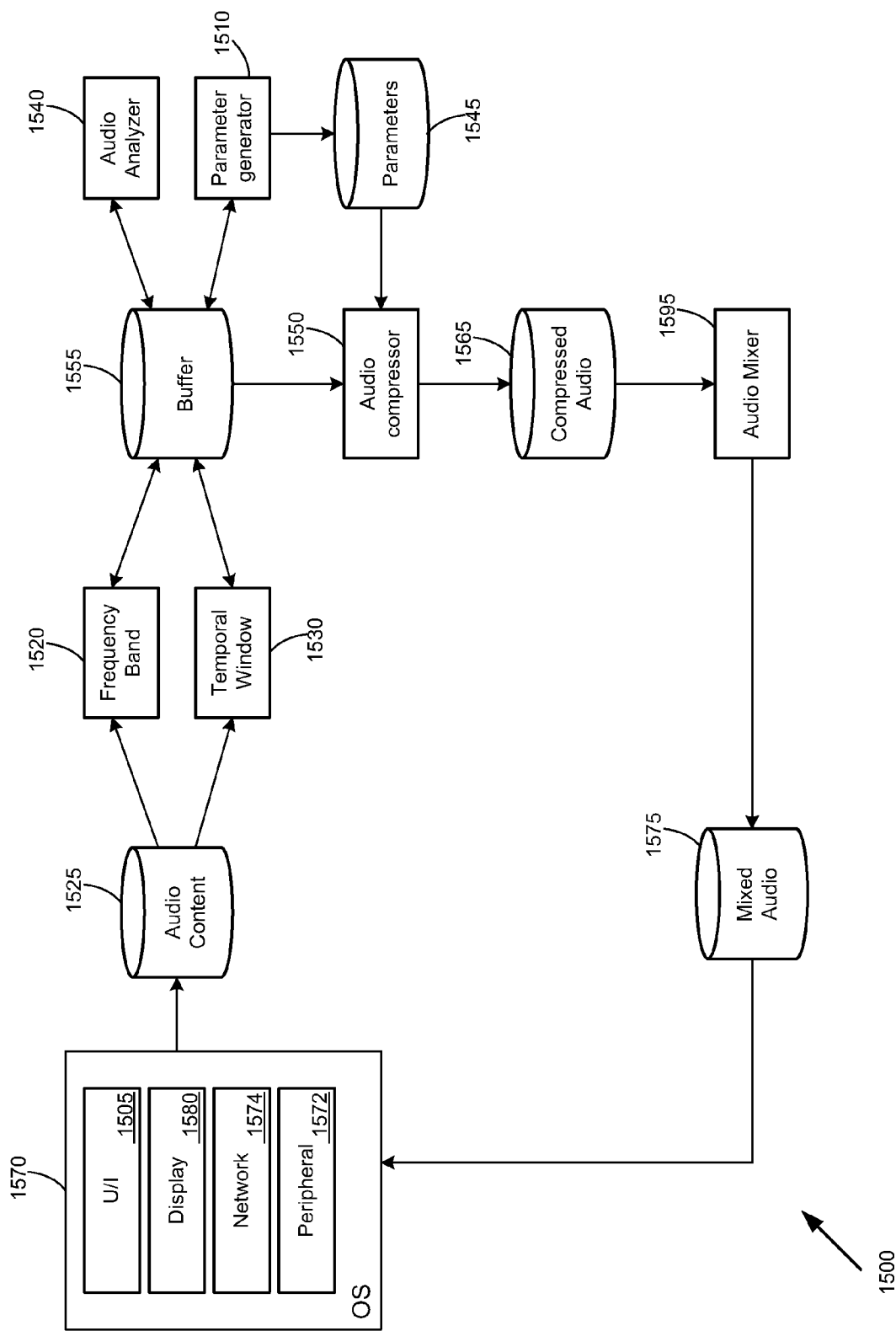
FIG. 15 conceptually illustrates the software architecture of a media editing application that implements automatic detection of audio compression parameters.

In some embodiments, the processes described above are implemented as software running on a particular machine, such as a computer or a handheld device, or stored in a computer readable medium. FIG. 15 conceptually illustrates the software architecture of a media editing application 1500 of some embodiments. In some embodiments, the media editing application is a stand-alone application or is integrated into another application, while in other embodiments the application might be implemented within an operating system. Furthermore, in some embodiments, the application is provided as part of a server-based solution. In some of these embodiments, the application is provided via a thin client. That is, the application runs on a server while a user interacts with the application via a separate machine that is remote from the server. In other such embodiments, the application is provided via a thick client. That is, the application is distributed from the server to the client machine and runs on the client machine.

The media editing application 1500 includes a user interface (UI) module 1505, a frequency band module 1520, a temporal window partition module 1530, a parameter generator module 1510, an audio analyzer module 1540, an audio compressor 1550, and an audio mixer 1595. The media editing application 1500 also includes audio content data storage 1525, parameter storage 1545, buffer storage 1555, compressed audio storage 1565, and mixed audio storage 1575.

In some embodiments, storages 1525, 1555, 1545, 1565, and 1575 are all part of a single physical storage. In other embodiments, the storages 1525, 1555, 1565, and 1575 are in separate physical storages, or two of the storages are in one physical storage, while the third storage is in a different physical storage. For instance, the audio content storage 1525 the buffer storage 1555, the mixed audio storage 1575, and compressed audio storage 1565 will often not be separated in different physical storages.

The UI module 1505 in some embodiments is part of an operating system 1570 that includes input peripheral driver(s) 1572, a display module 1580, and network connection interface(s) 1574. In some embodiments, as illustrated, the input peripheral drivers 1572, the display module 1580, and the network connection interfaces 1574 are part of the operating system 1570, even when the media editing application 1500 is an application separate from the operating system.

The peripheral device drivers 1572 may include drivers for accessing external storage devices, such as flash drives or external hard drives. The peripheral device drivers 1572 then deliver the data from the external storage device to the UI module 1505. The peripheral device drivers 1572 may also include drivers for translating signals from a keyboard, mouse, touchpad, tablet, touchscreen, etc. A user interacts with one or more of these input devices, which send signals to their corresponding device drivers. The device drivers then translate the signals into user input data that is provided to the UI module 1505.

The media editing application 1500 of some embodiments includes a graphical user interface that provides users with numerous ways to perform different sets of operations and functionalities. In some embodiments, these operations and functionalities are performed based on different commands that are received from users through different input devices (e.g., keyboard, track pad, touchpad, touchscreen, mouse, etc.) For example, the present application describes a selection of a graphical user interface object by a user for activating the automatic audio compression setting detection operation. Such selection can be implemented by an input device interacting with the graphical user interface. In some embodiments, objects in the graphical user interface can also be controlled or manipulated through other controls, such as touch controls. In some embodiment, touch control is implemented through an input device that can detect the presence and location of touch on a display of the device. An example of such a device is a touch screen device. In some embodiments, with touch control, a user can directly manipulate objects by interacting with the graphical user interface that is displayed on the display of the touch screen device. For instance, a user can select a particular object in the graphical user interface by simply touching that particular object on the display of the touch screen device. As such, when touch control is utilized, a cursor may not even be provided for enabling selection of an object of a graphical user interface in some embodiments. However, when a cursor is provided in a graphical user interface, touch control can be used to control the cursor in some embodiments.

The display module 1580 translates the output of a user interface for a display device. That is, the display module 1580 receives signals (e.g., from the UI module 1505) describing what should be displayed and translates these signals into pixel information that is sent to the display device. The display device may be an LCD, plasma screen, CRT monitor, touchscreen, etc.

The network connection interface 1574 enable the device on which the media editing application 1500 operates to communicate with other devices (e.g., a storage device located elsewhere in the network that stores the raw audio data) through one or more networks. The networks may include wireless voice and data networks such as GSM and UMTS, 802.11 networks, wired networks such as Ethernet connections, etc.

The UI module 1505 of media editing application 1500 interprets the user input data received from the input device drivers and passes it to various modules, including the audio analyzer 1540 and the parameter generator 1510. The UI module 1505 also manages the display of the UI, and outputs this display information to the display module 1580. This UI display information may be based on information from the audio analyzer 1540, from the audio compressor 1550, from buffer storage 1555, from audio mixer 1595, or directly from input data (e.g., when a user moves an item in the UI that does not affect any of the other modules of the application 1500).

The audio content storage 1525 stores the audio content that is to have its dynamic range compressed by the audio compressor 1550. In some embodiments, the UI module 1505 stores the audio content of a media clip or an audio file in the audio content storage 1525 when the user has activated the automatic audio compression setting detection operation (e.g., by selecting the audio compression parameter detection UI item 155.) The audio content stored in the audio content storage 1525 is retrieved and partitioned by temporal window module 1530 and/or the frequency band module 1520 before being stored in the buffer storage module 1555.

The frequency band module 1520 performs filtering operations that partition the audio content into several frequency bands. The partitioned audio is stored in the buffer storage 1555. The temporal window module 1530 partitions the audio content temporally into different temporal components. In some embodiments, the temporal window module 1530 retrieves and partitions audio content that has already been partitioned by the frequency band module 1520.

The buffer storage 1555 stores the intermediate audio content between the frequency band module 1520, the temporal window module 1530, and the audio analyzer module 1540. The buffer storage 1555 also stores the result of the audio content analysis performed by the audio analyzer module 1540 for use by the parameter generator module 1510.

The audio analyzer module 1540 fetches the audio content partitioned by the frequency band module 1520 and the temporal window module 1530 and computes RMS values for the partitioned audio content. The audio analyzer then performs the analysis of the audio content as discussed above by reference to FIG. 7 (e.g., measures the highest and the lowest audio level, performs statistical analysis, and determines the peak and floor audio levels). The audio analyzer module then stores the result of the analysis in the buffer storage 1555.

The parameter generator module 1510 generates the noise gate, threshold, and ratio parameters based on the audio content analysis result retrieved from the buffer storage 1555. The audio compression parameters generated are then stored in the parameter storage 1545 for access by the audio compressor 1550.

The audio compressor module 1550 fetches the generated audio compression parameter from the parameter storage 1545 and performs dynamic range compression on the audio content stored in the buffer storage 1555. The audio compressor module 1550 then stores the compressed audio in the compressed audio storage 1565. For embodiments that partition audio content, the audio compressor module compresses each component of the partitioned audio content according to the component's audio compression parameter and stores the compressed audio for that component in the compressed audio storage 1565.

The audio mixer module 1595 retrieves the compressed audio from the compressed audio storage 1565 from each component of the partitioned audio content. The audio mixer module 1595 then mixes the compressed audio from the different components into a final mixed audio according to the frequency band and the temporal window associated with each component of the audio content. The final mixed audio result is then stored in the mixed audio storage 1575 for retrieval and use by the user of the media editing application 1500.

For some embodiments that do not partition audio content along frequency or time, the media editing application 1500 would treat the audio content as having only one component part (i.e., not partitioned). In some of these embodiments, the media editing application 1500 does not have the frequency band module 1520, the temporal window module 1530, the audio mixer module 1595, the audio content storage 1525, or the mixed audio storage 1575. The buffer storage 1555 receives audio content directly from the UI module 1505 and the compressed audio is delivered directly to the UI module from the compressed audio storage.

While many of the features have been described as being performed by one module, one of ordinary skill in the art will recognize that the functions described herein might be split up into multiple modules. Similarly, functions described as being performed by multiple different modules might be performed by a single module in some embodiments (e.g., the functions of the audio analyzer module 1540 and the parameter generator module 1550 can be performed as a single module, etc.).

VI. Electronic System

Many of the above-described features and applications are implemented as software processes that are specified as a set of instructions recorded on a computer readable storage medium (also referred to as computer readable medium). When these instructions are executed by one or more computational or processing unit(s) (e.g., one or more processors, cores of processors, or other processing units), they cause the processing unit(s) to perform the actions indicated in the instructions. Examples of computer readable media include, but are not limited to, CD-ROMs, flash drives, random access memory (RAM) chips, hard drives, erasable programmable read only memories (EPROMs), electrically erasable programmable read-only memories (EEPROMs), etc. The computer readable media does not include carrier waves and electronic signals passing wirelessly or over wired connections.

In this specification, the term "software" is meant to include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 16:
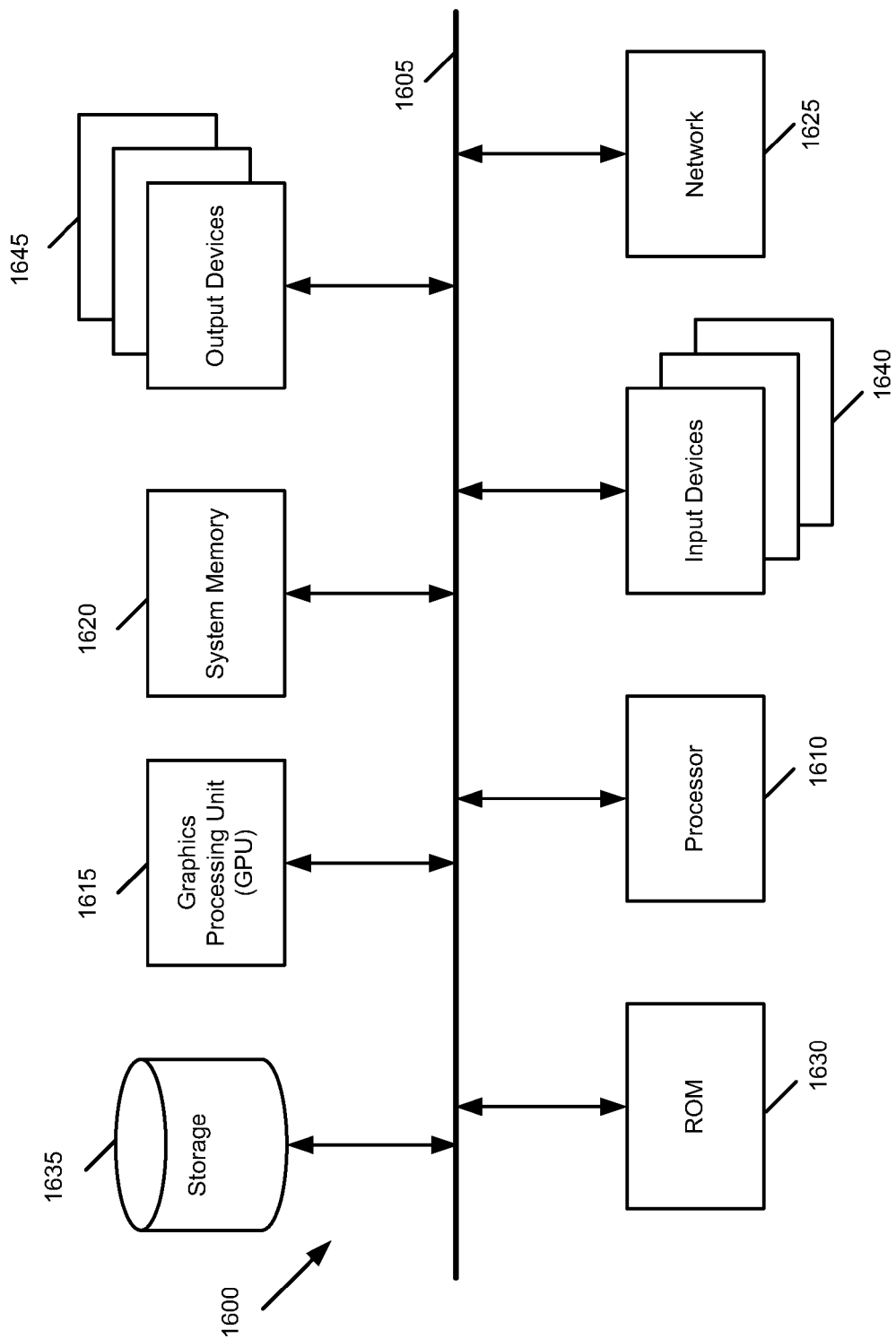
FIG. 16 conceptually illustrates an electronic system 1600 with which some embodiments of the invention are implemented.

FIG. 16 conceptually illustrates an electronic system 1600 with which some embodiments of the invention are implemented. The electronic system 1600 may be a computer (e.g., a desktop computer, personal computer, tablet computer, etc.), phone, PDA, or any other sort of electronic device. Such an electronic system includes various types of computer readable media and interfaces for various other types of computer readable media. Electronic system 1600 includes a bus 1605, processing unit(s) 1610, a graphics processing unit (GPU) 1615, a system memory 1620, a network 1625, a read-only memory 1630, a permanent storage device 1635, input devices 1640, and output devices 1645.

The bus 1605 collectively represents all system, peripheral, and chipset buses that communicatively connect the numerous internal devices of the electronic system 1600. For instance, the bus 1605 communicatively connects the processing unit(s) 1610 with the read-only memory 1630, the GPU 1615, the system memory 1620, and the permanent storage device 1635.

From these various memory units, the processing unit(s) 1610 retrieves instructions to execute and data to process in order to execute the processes of the invention. The processing unit(s) may be a single processor or a multi-core processor in different embodiments. Some instructions are passed to and executed by the GPU 1615. The GPU 1615 can offload various computations or complement the image processing provided by the processing unit(s) 1610. In some embodiments, such functionality can be provided using CoreImage's kernel shading language.

The read-only-memory (ROM) 1630 stores static data and instructions that are needed by the processing unit(s) 1610 and other modules of the electronic system. The permanent storage device 1635, on the other hand, is a read-and-write memory device. This device is a non-volatile memory unit that stores instructions and data even when the electronic system 1600 is off. Some embodiments of the invention use a mass-storage device (such as a magnetic or optical disk and its corresponding disk drive) as the permanent storage device 1635.

Other embodiments use a removable storage device (such as a floppy disk, flash memory device, etc., and its corresponding disk drive) as the permanent storage device. Like the permanent storage device 1635, the system memory 1620 is a read-and-write memory device. However, unlike storage device 1635, the system memory 1620 is a volatile read-and-write memory, such a random access memory. The system memory 1620 stores some of the instructions and data that the processor needs at runtime. In some embodiments, the invention's processes are stored in the system memory 1620, the permanent storage device 1635, and/or the read-only memory 1630. For example, the various memory units include instructions for processing multimedia clips in accordance with some embodiments. From these various memory units, the processing unit(s) 1610 retrieves instructions to execute and data to process in order to execute the processes of some embodiments.

The bus 1605 also connects to the input and output devices 1640 and 1645. The input devices 1640 enable the user to communicate information and select commands to the electronic system. The input devices 1640 include alphanumeric keyboards and pointing devices (also called "cursor control devices"), cameras (e.g., webcams), microphones or similar devices for receiving voice commands, etc. The output devices 1645 display images generated by the electronic system or otherwise output data. The output devices 1645 include printers and display devices, such as cathode ray tubes (CRT) or liquid crystal displays (LCD), as well as speakers or similar audio output devices. Some embodiments include devices such as a touchscreen that function as both input and output devices.

Finally, as shown in FIG. 16, bus 1605 also couples electronic system 1600 to a network 1625 through a network adapter (not shown). In this manner, the computer can be a part of a network of computers (such as a local area network ("LAN"), a wide area network ("WAN"), an intranet, or a network of networks, such as the Internet). Any or all components of electronic system 1600 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself In addition, some embodiments execute software stored in programmable logic devices (PLDs), ROM, or RAM devices.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, at least some of the figures (including FIGS. 6 and 7) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A method for compressing a dynamic range of an audio content, the method comprising:
   receiving, at a device, the audio content;
   determining a target range of the audio content based on predefined parameters;
   analyzing the audio content in order to identify a detected range according to a peak level and a floor level of the audio content;
   generating a set of audio compression parameters based on the peak level and floor level of the audio content, wherein at least one audio compression parameter is a ratio parameter for expressing a difference between the target range and the detected range; and
   compressing the dynamic range of the audio content by using the set of audio compression parameters.

2. The method of claim 1, wherein the audio compression parameters further comprise a noise gate parameter and a threshold parameter.

3. The method of claim 1, wherein analyzing the audio content comprises determining a probability distribution for the audio content by determining a probability of each of a plurality of ranges of audio levels.

4. The method of claim 3, wherein determining the probability distribution for the audio content comprises determining a mean value and a standard deviation value for the audio content.

5. The method of claim 3, wherein the audio compression parameters comprise a noise gate parameter that causes an audio compressor to attenuate audio signals below a particular audio level that is defined according to the probability distribution of the audio content.

6. The method of claim 3, wherein the audio compression parameters comprise a threshold parameter that causes an audio compressor to reduce the dynamic range of the audio content by reducing gain of audio levels above a particular level that is defined according to the probability distribution of the audio content.

7. The method of claim 6, wherein the ratio parameter specifies an amount of gain reduction for signals above a particular audio level specified by the threshold parameter.

8. The method of claim 7, wherein the ratio parameter is determined by detecting a peak level and a floor level for the audio content at two particular audio levels that are defined according to the probability distribution of the audio content.

9. The method of claim 1, wherein the set of audio compression parameters is one of a plurality of sets of audio compression parameters generated for the audio content, wherein each set of audio compression parameters is based on an analysis of a frequency range of the audio content.

10. The method of claim 1, wherein the set of audio compression parameters is one of a plurality of sets of audio compression parameters generated for the audio content, wherein each set of audio compression parameters is based on an analysis of a temporal range of the audio content.

11. A computing device that compresses a dynamic range of an audio content, the computing device comprising:
    an audio analyzer that receives the audio content;
    an audio compression parameter generator that:
       identifies a detected range according to a peak level and a floor level of the audio content;
       determines a target range of the audio content based on predefined parameters; and
       generates a set of audio compression parameters based on the peak level and floor level of the audio content, wherein at least one audio compression parameter is a ratio parameter for expressing a difference between the target range and the detected range; and
    an audio compressor that compresses the dynamic range of the audio content by using the set of audio compression parameters.

12. The computing device of claim 11, wherein the audio compression parameters further comprise a noise gate parameter and a threshold parameter.

13. The computing device of claim 11, wherein the audio analyzer analyzes the audio content by determining a probability distribution for the audio content by determining a probability of each of a plurality of ranges of audio levels.

14. The computing device of claim 13, wherein determining the probability distribution for the audio content comprises determining a mean value and a standard deviation value for the audio content.

15. The computing device of claim 13, wherein the set of audio compression parameters comprises a noise gate parameter that causes the audio compressor to attenuate audio signals below a particular audio level that is defined by the audio compression parameter generator according to the probability distribution of the audio content.

16. The computing device of claim 13, wherein the set of audio compression parameters comprises a threshold parameter that causes the audio compressor to reduce the dynamic range of the audio content by reducing the gain of audio levels above a particular level that is defined by the audio compression parameter generator according to the probability distribution of the audio content.

17. The computing device of claim 16, wherein the ratio parameter specifies an amount of gain reduction for signals above the particular audio level specified by the threshold parameter.

18. The computing device of claim 17, wherein the audio compression parameter generator determines the ratio parameter by detecting a peak level and a floor level for the audio content at two particular audio levels that are defined according to the probability distribution of the audio content.

19. The computing device of claim 11, wherein the audio analyzer analyzes each of a plurality of frequency components of the audio content and the audio compression parameter generator generates a set of audio compression parameters for each of the plurality of frequency components.

20. The computing device of claim 11, wherein the audio analyzer analyzes each of a plurality of temporal components of the audio content and the audio compression parameter generator generates a set of audio compression parameters for each of the plurality of temporal components.

21. A non-transitory machine readable medium storing a program for compressing a dynamic range of an audio content, the program executable by one or more processing units, the program comprising sets of instructions for:
- receiving the audio content;
- determining a target range of the audio content based on predefined parameters;
- identifying a detected range based on a peak level and a floor level of the audio content;
- generating a set of audio compression parameters based on the peak level and floor level of the audio content, wherein at least one audio compression parameter is a ratio parameter for expressing a difference between the target range and the detected range; and
- compressing the dynamic range of the audio content by using the set of audio compression parameters.

22. The non-transitory machine readable medium of claim 21, wherein the program further comprises a set instructions for determining a probability distribution for the audio content by determining a probability of each of a plurality of ranges of audio levels.

23. The non-transitory machine readable medium of claim 22, wherein the audio compression parameters comprise a noise gate parameter that causes an audio compressor to attenuate audio signals below a particular audio level that is defined according to the probability distribution of the audio content.

24. The non-transitory machine readable medium of claim 22, wherein the audio compression parameters comprise a threshold parameter that causes an audio compressor to reduce the dynamic range of the audio content by reducing gain of the audio levels above a particular level that is defined according to the probability distribution of the audio content.

25. The non-transitory machine readable medium of claim 24, wherein the ratio parameter specifies an amount of gain reduction for signals above the particular audio level specified by the threshold parameter, the ratio parameter determined by a set of instructions for detecting a peak level and a floor level for the audio content at two particular audio levels that are defined according to the probability distribution of the audio content.

* * * * *